United States Patent
Higuchi et al.

(10) Patent No.: US 7,265,482 B2
(45) Date of Patent: Sep. 4, 2007

(54) POTASSIUM NIOBATE DEPOSITED BODY AND METHOD FOR MANUFACTURING THE SAME, SURFACE ACOUSTIC WAVE DEVICE, FREQUENCY FILTER, OSCILLATOR, ELECTRONIC CIRCUIT, AND ELECTRONIC APPARATUS

(75) Inventors: Takamitsu Higuchi, Matsumoto (JP); Takeshi Kijima, Matsumoto (JP); Mayumi Ueno, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/372,418

(22) Filed: Mar. 9, 2006

(65) Prior Publication Data

US 2006/0243198 A1 Nov. 2, 2006

(30) Foreign Application Priority Data

Mar. 30, 2005 (JP) .............................. 2005-097976

(51) Int. Cl.
*H01L 41/08* (2006.01)
(52) U.S. Cl. ..................... 310/360; 29/25.35
(58) Field of Classification Search ............... 310/360; 427/497; 29/25.35
See application file for complete search history.

(56) References Cited

U.S. PATENT DOCUMENTS

| | | | | |
|---|---|---|---|---|
| 4,224,548 A | * | 9/1980 | O'Connell | 310/360 |
| 4,232,240 A | * | 11/1980 | O'Connell | 310/313 A |
| 5,936,329 A | * | 8/1999 | Shibata et al. | 310/360 |
| 2004/0189425 A1 | | 9/2004 | Iwashita et al. | |
| 2004/0197599 A1 | | 10/2004 | Higuchi et al. | |
| 2004/0237882 A1 | | 12/2004 | Higuchi et al. | |
| 2006/0222895 A1 | * | 10/2006 | Higuchi et al. | 428/701 |

FOREIGN PATENT DOCUMENTS

| | | |
|---|---|---|
| JP | 2004-224627 | 8/2004 |
| JP | 2004-235874 | 8/2004 |
| JP | 2004-292226 | 10/2004 |
| JP | 2004-292228 | 10/2004 |
| JP | 2006-278870 | * 10/2006 |
| JP | 2006-279532 | * 10/2006 |
| JP | 2006-279713 | * 10/2006 |
| WO | WO-2002-080359 | * 10/2002 |

OTHER PUBLICATIONS

Hiroyuki Odagawa, et al., "Superhigh Electromechanical Coupling and Zero-Temperature Characteristics of $KNbO_3$ and Wide Band Filter Applications", Jpn. J. Appl. Phys., vol. 37, pp. 2929-2932 (1998).

* cited by examiner

*Primary Examiner*—Thomas M. Dougherty
(74) *Attorney, Agent, or Firm*—Harness, Dickey & Pierce, P.L.C.

(57) ABSTRACT

A potassium niobate deposited body includes an R-plane sapphire substrate, a buffer layer composed of a metal oxide and formed above the R-plane sapphire substrate, a lead zirconate titanate niobate layer formed above the buffer layer, and a potassium niobate layer or a potassium niobate solid solution layer formed above the lead zirconate titanate niobate layer.

20 Claims, 18 Drawing Sheets

Al$_2$O$_3$ (0006)
(2θ = 41.7°)

MgO (202)
(2θ = 62.3°)

PZTN (101)
KNbO$_3$ (101)$_{pc}$
(2θ = 31.5°)

(×1000)

LEAD OCTYLATE

NIOBIUM OCTYLATE

LEAD NIOBIUM OCTYLATE

DIMETHYL SUCCINATE

DIETHYL SUCCINATE

FIG. 27B  [CHAIN SATURATED POLYCARBOXYLIC ACID]
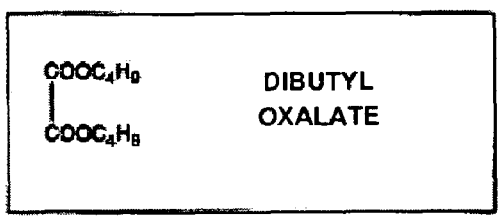
DIBUTYL OXALATE
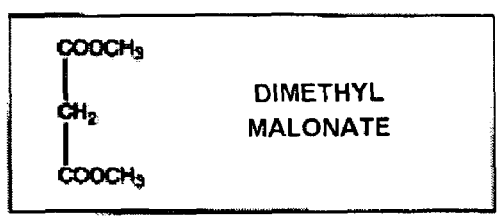
DIMETHYL MALONATE
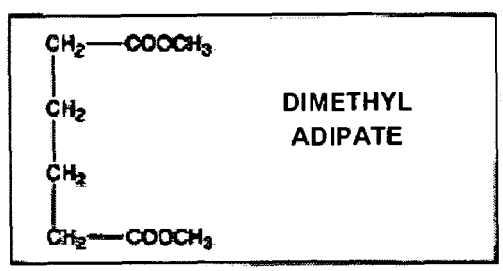
DIMETHYL ADIPATE
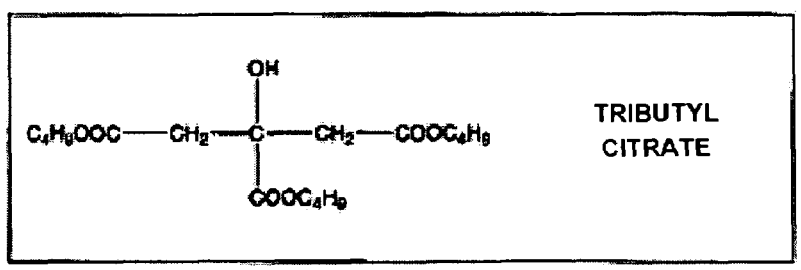
TRIBUTYL CITRATE
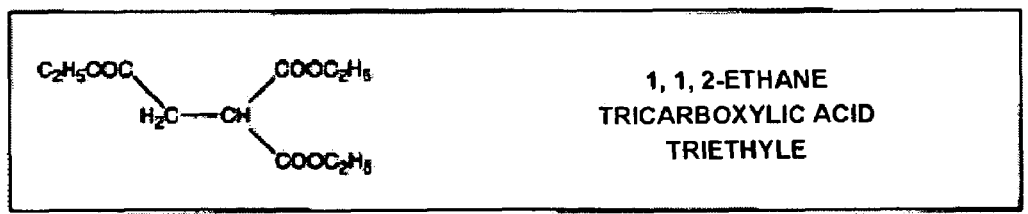
1, 1, 2-ETHANE TRICARBOXYLIC ACID TRIETHYLE
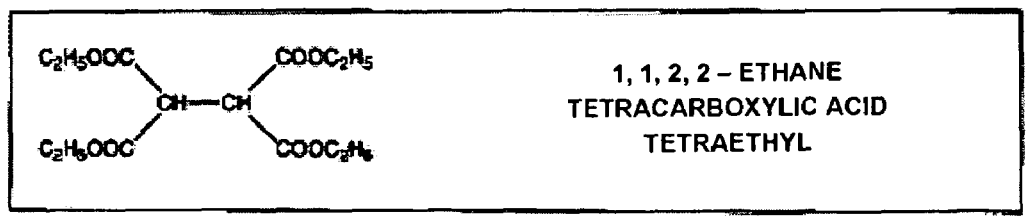
1, 1, 2, 2 - ETHANE TETRACARBOXYLIC ACID TETRAETHYL

[CHAIN UNSATURATED POLYCARBOXYLIC ACID]

DIMETHYL MALEATE

DIETHYL FUMARATE

TRANS-ACONITIC ACID

FIG. 27D      [CYCLIC POLYCARBOXYLIC ACID]

TRIMESIC ACID

PYROMELLITIC ACID 1, 2, 4- BENZEN TRICARBOXYLIC ACID TRIMETHYL 1, 2, 3, 4- CYCLOPENTANE TETRACARBOXYLIC ACID

POTASSIUM NIOBATE DEPOSITED BODY AND METHOD FOR MANUFACTURING THE SAME, SURFACE ACOUSTIC WAVE DEVICE, FREQUENCY FILTER, OSCILLATOR, ELECTRONIC CIRCUIT, AND ELECTRONIC APPARATUS

The entire disclosure of Japanese Patent Application No. 2005-097976, filed Mar. 30, 2005 is expressly incorporated by reference herein.

BACKGROUND

1. Technical Field

The present invention relates to potassium niobate deposited bodies and methods for manufacturing the same, surface acoustic wave elements, frequency filters, oscillators, electronic circuits, and electronic apparatuses.

2. Related Art

Accompanying the substantial development in the telecommunications field, demands for surface acoustic wave elements are rapidly expanding. The development of surface acoustic wave elements is advancing toward further miniaturization, higher efficiency and higher frequencies. To meet such demands, larger electromechanical coupling coefficient, more stable temperature characteristics and greater surface acoustic wave propagation speeds are required.

It has been found that a single crystal substrate of potassium niobate ($KNbO_3$) (a=0.5695 nm, b=0.3973 nm and c=0.5721 nm as an orthorhombic system expression, and a=0.4015 nm as a cubic system expression) exhibited a large value of electromechanical coupling coefficient. For example, as described in Jpn. J. Appl. Phys. Vol. 37 (1998) 2929, it was confirmed by experiments that a 0° Y-cut X propagation $KNbO_3$ single crystal substrate (hereafter referred to as a "0° Y—X—$KNbO_3$ substrate) would exhibit a very large value of electromechanical coupling coefficient reaching as much as about 50%. Also, the same reference reports that the oscillation frequency of a filter using 45° to 75° rotated Y-cut X propagation $KNbO_3$ single crystal substrate (hereafter referred to as a "rotated Y—X—$KNbO_3$ substrate") exhibited a zero-temperature characteristic around room temperature.

In a surface acoustic wave element that uses a piezoelectric single crystal substrate, its electromechanical coupling coefficient, temperature coefficient, and acoustic velocity define values peculiar to the piezoelectric material used, and are decided according to a cut angle and a propagation direction. 0° Y—X—$KNbO_3$ single crystal substrates exhibit an excellent electromechanical coupling coefficient, but do not exhibit a zero-temperature characteristic like 45° to 75° rotated Y—X—$KNbO_3$ substrates around room temperature. Moreover, the acoustic velocity of a 0° Y—X—$KNbO_3$ single crystal substrate is lower compared to $SrTiO_3$ which is the same perovskite type oxide. Thus, all of the requirements of high electromechanical coupling coefficient, zero-temperature characteristic and high acoustic velocity cannot be satisfied by merely using a $KNbO_3$ single crystal substrate. Moreover, it may be difficult to manufacture a surface acoustic wave element by forming a thin film of potassium niobate on a certain substrate having a large area.

SUMMARY

In accordance with an aspect of the present invention, there are provided a potassium niobate deposited body having a potassium niobate thin film, and a method for manufacturing the same.

In accordance with another aspect of the invention, a surface acoustic wave element with a high electromechanical coupling coefficient is provided.

In accordance with still another aspect of the invention, frequency filters, oscillators, electronic circuits, and electronic equipment including the surface acoustic wave element are provided.

A potassium niobate deposited body in accordance with an embodiment of the invention includes:

an R-plane sapphire substrate;

a buffer layer composed of a metal oxide and formed above the R-plane sapphire substrate;

a lead zirconate titanate niobate layer formed above the buffer layer; and a potassium niobate layer or a potassium niobate solid solution layer formed above the lead zirconate titanate niobate layer.

It is noted that, in the invention, forming another specific member (hereafter referred to as "B") above a specific member (hereafter referred to as "A") includes a case of forming "B" directly on "A," and a case of forming "B" over "A" through another member on "A." Also, in the invention, "B" formed above "A" includes "B" formed directly on "A," and "B" formed above "A" through another member on "A."

In the potassium niobate deposited body in accordance with an aspect of the invention, the R-plane sapphire substrate may be an R-plane (1-102).

In the potassium niobate deposited body in accordance with an aspect of the invention, the buffer layer may epitaxially grow in a (100) orientation in a cubic system expression, and a (100) plane of the buffer layer may tilt with a [11-20] direction vector as a rotation axis with respect to the R-plane (1-102) of the R-plane sapphire substrate.

In the potassium niobate deposited body in accordance with an aspect of the invention, an angle defined between the (100) plane of the buffer layer and the R-plane (1-102) of the R-plane sapphire substrate may be 1 degree or greater but 15 degrees or smaller.

In the potassium niobate deposited body in accordance with an aspect of the invention, the potassium niobate layer or the potassium niobate solid solution layer may epitaxially grow in a (100) orientation in a psuedo cubic system expression, and a (100) plane of the potassium niobate layer or the potassium niobate solid solution layer may tilt with a [11-20] direction vector as a rotation axis with respect to the R-plane (1-102) of the R-plane sapphire substrate.

In the potassium niobate deposited body in accordance with an aspect of the invention, an angle defined between a (100) plane of the potassium niobate layer or the potassium niobate solid solution layer and the R-plane (1-102) of the R-plane sapphire substrate may be 1 degree or greater but 15 degrees or smaller.

In the potassium niobate deposited body in accordance with an aspect of the invention, the lead zirconate titanate niobate layer may epitaxially grow in a (100) orientation in a cubic system expression, and a (100) plane of the lead zirconate titanate niobate layer may tilt with a [11-20] direction vector as a rotation axis with respect to the R-plane (1-102) of the R-plane sapphire substrate.

In the potassium niobate deposited body in accordance with an aspect of the invention, an angle defined between a (100) plane of the lead zirconate titanate niobate layer and the R-plane (1-102) of the R-plane sapphire substrate may be 1 degree or greater but 15 degrees or smaller.

In the potassium niobate deposited body in accordance with an aspect of the invention, the buffer layer may consist of a metal oxide having a rock salt structure.

In the potassium niobate deposited body in accordance with an aspect of the invention, the metal oxide may be magnesium oxide.

In the potassium niobate deposited body in accordance with an aspect of the invention, the potassium niobate solid solution layer may be a solid solution that is expressed by $K_{1-x}Na_xNb_{1-y}Ta_yO_3$ ($0<x<1$, $0<y<1$).

In the potassium niobate deposited body in accordance with an aspect of the invention, the lead zirconate titanate niobate layer may include niobium in 5 mol % or greater and 30 mol % or smaller with respect to niobium, titanium and zirconium.

In the potassium niobate deposited body in accordance with an aspect of the invention, the lead zirconate titanate niobate layer may further include silicon or silicon and germanium in 0.5 mol % or greater.

The potassium niobate deposited body in accordance with an aspect of the invention may further include another lead zirconate titanate niobate layer above the potassium niobate layer.

A method for manufacturing a potassium niobate deposited body in accordance with an embodiment of the invention includes the steps of:

forming, above an R-plane sapphire substrate, a buffer layer that epitaxially grows in a (100) orientation in a cubic system expression;

forming, above the buffer layer, a lead zirconate titanate niobate layer by coating a precursor composition, and then applying a heat treatment to the precursor composition; and forming a potassium niobate layer or a potassium niobate solid solution layer above the lead zirconate titanate niobate layer, wherein the precursor composition includes a precursor for forming lead zirconate titanate niobate, and the precursor includes at least niobium, titanium and zirconium, and may have an ester bond in part.

In the method for manufacturing a potassium niobate deposited body in accordance with an aspect of the invention, the precursor may further include lead.

In the method for manufacturing a potassium niobate deposited body in accordance with an aspect of the invention, the precursor composition may be formed from the precursor dissolved or dispersed in a solvent.

In the method for manufacturing a potassium niobate deposited body in accordance with an aspect of the invention, the precursor composition may be obtained by mixing sol-gel raw materials including hydrolysis-condensation products of metal alkoxides of at least niobate, titanium and zirconium, polycarboxylic acid or polycarboxylic acid ester, and an organic solvent, and may include a precursor having ester bonds by esterification of the polycarboxylic acid or polycarboxylic acid originated from the polycarboxylic acid ester and the metal alkoxides.

In the method for manufacturing a potassium niobate deposited body in accordance with an aspect of the invention, the polycarboxylic acid or the polycarboxylic acid ester may be polycarboxylic acid or polycarboxylic acid ester with a valence of 2.

In the method for manufacturing a potassium niobate deposited body in accordance with an aspect of the invention, when the sol-gel raw materials, the polycarboxylic acid or polycarboxylic acid ester, and the organic solvent are mixed, a sol-gel raw material using metal carboxylate may be further included.

In the method for manufacturing a potassium niobate deposited body in accordance with an aspect of the invention, the metal carboxylate may be lead carboxylate.

In the method for manufacturing a potassium niobate deposited body in accordance with an aspect of the invention, when the sol-gel raw materials, the polycarboxylic acid or polycarboxylic acid ester and the organic solvent are mixed, an organic metal compound may further be included.

In the method for manufacturing a potassium niobate deposited body in accordance with an aspect of the invention, when the sol-gel raw materials, the polycarboxylic acid or polycarboxylic acid ester, and the organic solvent are mixed, a sol-gel raw material including silicon or silicon and germanium may further be used.

The method for manufacturing a potassium niobate deposited body in accordance with an aspect of the invention may further include forming another lead zirconate titanate niobate layer by coating the precursor composition on the potassium niobate layer or the potassium niobate solid solution layer, and then heat treating the precursor composition.

A surface acoustic wave element in accordance with an embodiment of the invention has the potassium niobate deposited body described above.

A frequency filter in accordance with an embodiment of the invention has the surface acoustic wave element described above.

An oscillator in accordance with an embodiment of the invention has the surface acoustic wave element described above.

An electronic circuit in accordance with an embodiment of the invention includes at least one of the frequency filter described above and the oscillator described above.

An electronic apparatus in accordance with an embodiment of the invention includes the electronic circuit described above.

BRIEF DESCRIPTION OF THE DRAWINGS

FIG. 27B shows polycarboxylic acid or polycarboxylic acid ester, which are used in the first embodiment.

FIG. 27D shows polycarboxylic acid or polycarboxylic acid ester, which are used in the first embodiment.

DESCRIPTION OF EXEMPLARY EMBODIMENTS

Preferred embodiments of the present invention are described below with reference to the accompanying drawings.

Figure 1:
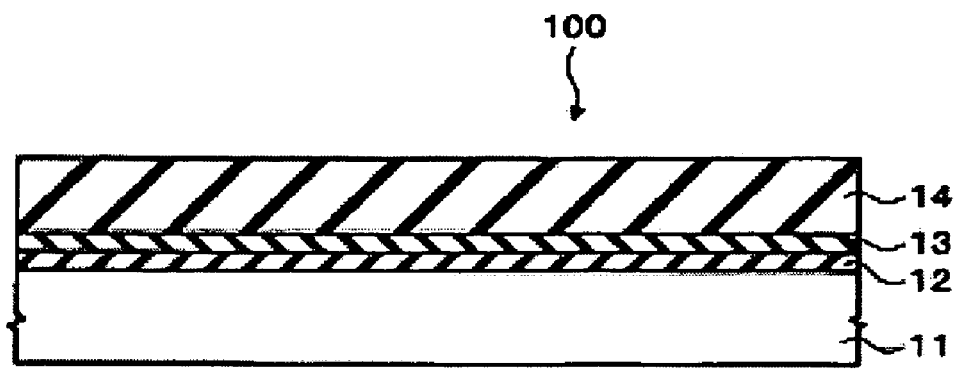
FIG. 1 is a cross-sectional view schematically showing a potassium niobate deposited body in accordance with a first embodiment.

1. First Embodiment 1.1. FIG. 1 is a cross-sectional view schematically showing a potassium niobate deposited body 100 in accordance with an embodiment of the invention. As shown in FIG. 1, the potassium niobate deposited body 100 of the present embodiment may include a substrate 11, a buffer layer 12 formed on the substrate 11, a lead zirconate titanate niobate layer 13 formed on the buffer layer 12, and a potassium niobate layer 14 formed on the lead zirconate titanate niobate layer 13.

An R-plane sapphire substrate may be used as the substrate 11. The use of an R-plane sapphire substrate is desirable because the buffer layer 12, the lead zirconate titanate niobate layer 13 and the potassium niobate layer 14 can be epitaxially grown thereon, a substrate with a large surface area can be obtained at a low price, and the R-plane sapphire substrate has a tolerance to etchant and can be used repeatedly.

As the buffer layer 12, for example, a metal oxide having a rock salt structure can be used. For example, magnesium oxide (MgO) may be used as the metal oxide having a rock salt structure.

The buffer layer 12 may preferably epitaxially grow in a (100) orientation in a cubic system expression. A (100) plane of the buffer layer 12 may preferably tilt with a [11-20] direction vector as a rotation axis with respect to the R-plane (1-102) of the R-plane sapphire substrate 11. The above will be described with reference to FIG. 2 and FIG. 3.

Figure 2:
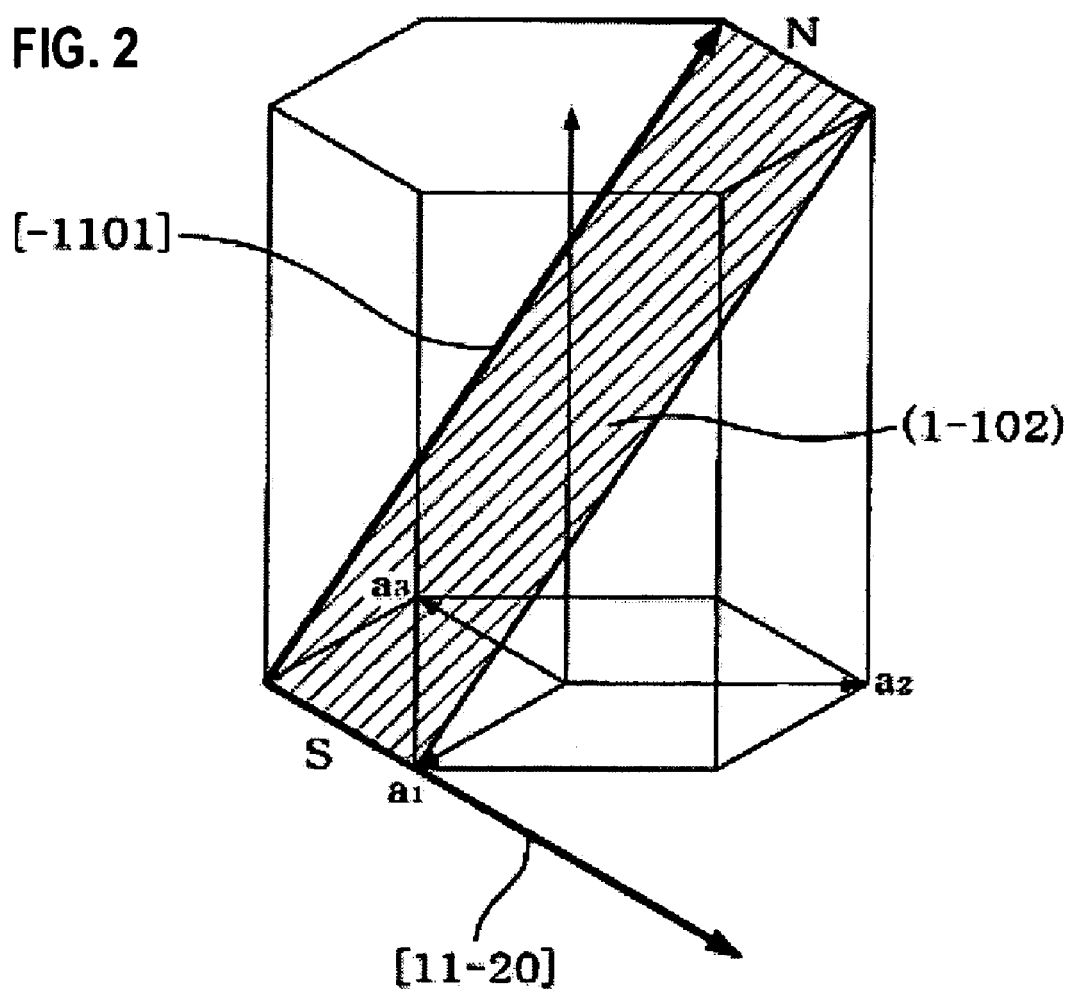
FIG. 2 is a view schematically showing a hexagonal sapphire crystal.
Figure 3:
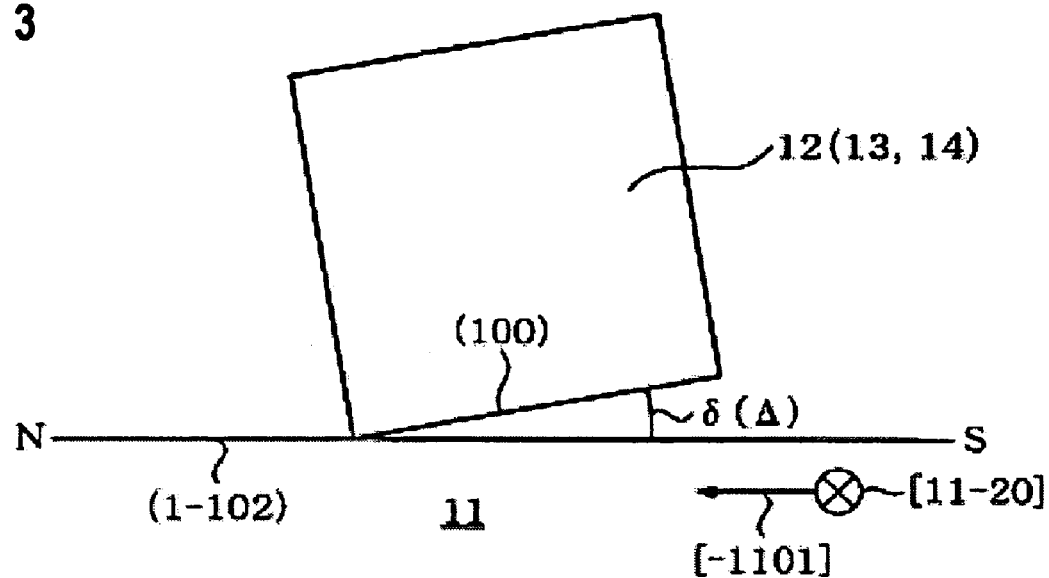
FIG. 3 is a view schematically showing tilts between a buffer layer, a lead zirconate titanate niobate layer and a potassium niobate layer.

FIG. 2 is a view schematically showing a hexagonal sapphire crystal, and FIG. 3 is a view schematically showing a tilt of the (100) plane of the buffer layer 12. The R-plane (1-102) of the R-plane sapphire substrate 11 corresponds to an N-S plane in FIG. 2. As shown in FIG. 3, with respect to the N-S plane (in other words, the R-plane) of the R-plane sapphire substrate 11, the (100) plane of the buffer layer 12 tilts with the [11-20] direction vector as a rotation axis. In other words, a linear line defined at a crossing between the (100) plane of the buffer layer 12 and the R-plane extends in parallel with the [11-20] direction vector. By forming such a buffer layer 12, a desired potassium niobate layer 14 to be described below can be obtained. An angle δ defined between the (100) plane of the buffer layer 12 and the R-plane (1-102) of the R-plane sapphire substrate 11 may preferably be 1 degree or greater but 15 degrees or smaller.

The lead zirconate titanate niobate layer 13 epitaxially grows in a (100) orientation in a cubic system expression. A (100) plane of the lead zirconate titanate niobate layer 13 may tilt with the [11-20] direction vector as a rotation axis with respect to the R-plane (1-102) of the R-plane sapphire substrate 11, like the buffer layer 12. An angle defined between the (100) plane of the lead zirconate titanate niobate layer 13 and the R-plane (1-102) of the R-plane sapphire substrate 11 may preferably be 1 degree or greater but 15 degrees or smaller. It is noted that the angle defined between the (100) plane of the lead zirconate titanate niobate layer 13 and the R-plane may be the same as or different from the angle δ defined between the (100) plane of the buffer layer 12 and the R-plane.

The lead zirconate titanate niobate layer 13 may preferably include, as one of the characteristics of its composition, niobium in 5 mol % or greater, and more preferably, in 10 mol % or greater but 30 mol % or smaller with respect to niobium, titanium and zirconium. Also, the lead zirconate titanate niobate layer 13 of the present embodiment may preferably include silicon or silicon and germanium in 0.5 mol % or greater, and more preferably, 0.5 mol % or greater but 5 mol % or smaller.

Next, characteristics derived from the fact that the lead zirconate titanate niobate layer 13 includes niobium are described.

Because niobium has generally the same size as that of titanium (i.e., ionic radii are close to each other and atomic radii are identical), and weighs two times, it is hard for atoms to slip out the lattice even by collision among atoms by lattice vibration. Further, the valence of niobium is +5, which is stable. Therefore, even if lead slips out, the valence resulting from the vacated lead can be supplemented by $Nb^{5+}$. Also, even if a lead vacancy occurs at the time of crystallization, it is easier for niobium having a small size to enter than oxygen having a larger size to slip out.

Furthermore, niobium may also have a valence of +4, such that niobium can sufficiently substitute for $Ti^{4+}$. Moreover, niobium has a very strong covalent bond, and it is believed that lead is also difficult to slip out (H. Miyazawa, E. Natori, S. Miyashita; Jpn. J. Appl. Phys. 39 (2000) 5679).

Because the lead zirconate titanate niobate (PZTN) layer 13 includes niobium in the specific proportion described above, adverse effects by the lead vacancy are canceled, and excellent composition controllability can be obtained. As a result, PZTN has excellent surface morphology and non-conductivity, compared to an ordinary Pb (Zr, Ti) $O_3$ (PZT).

Until now, the niobium doping in PZT has been mainly performed into Zr-rich rhombohedral crystal regions, and its amount is extremely small, which is on the order of 0.2 to 0.025 mol % (see J. Am. Ceram. Soc, 84 (2001) 902 and Phys. Rev. Let, 83 (1999) 1347). The main reason why it has not been possible to dope a large amount of niobium is believed that the addition of 10 mol % of niobium, for example, would cause the crystallization temperature to elevate to 800° C. or higher.

Silicon may preferably be further added to the PZTN film, for example, in a rate of 0.5-5 mol %. This makes it possible to reduce the crystallization energy of the PZTN. In other words, the addition of silicon with niobium makes it possible to cause a reduction in the crystallization temperature of the PZTN. Also, silicon and germanium may be used instead of silicon.

The lead zirconate titanate niobate layer 13 is not limited to any particular film thickness, and may have a film thickness that improves the flatness of the buffer layer 12, and sufficiently cause an epitaxial growth of the potassium niobate layer 14, which may be, for example, 10 nm to 100 nm.

The potassium niobate layer 14 epitaxially grows in a (100) orientation in a pseudo cubic system expression. Further, as shown in FIG. 3, the (100) plane of the potassium niobate layer 14 tilts with a [11-20] direction vector as a rotation axis with respect to the R-plane (1-102) of the R-plane sapphire substrate 11. It is noted that FIG. 3 is a diagram schematically showing the tilt of the (100) plane of the buffer layer 12, as described above, but is also a diagram schematically showing the tilt of the (100) plane of the potassium niobate layer 14.

An angle Δ defined between the psuedo cubic (100) plane of the potassium niobate layer 14 and the R-plane (1-102) of the R-plane sapphire substrate 11 may preferably be 1 degree or greater but 15 degrees or smaller. It is noted that the angle Δ defined between the (100) plane of the potassium niobate layer 14 and the R-plane can be the same as or different from the angle δ defined between the (100) plane of the buffer layer 12 and the R-plane.

The potassium niobate layer 14 has potassium niobate in single crystal or polycrystal. The thickness of the potassium niobate layer 14 can be appropriately selected according to devices to which the potassium niobate deposited body is applied without any particular limitation, but may be, for example, 100 nm or greater but 10 μm or less.

In the present embodiment, instead of the potassium niobate layer 14 described above, it may be a layer of potassium niobate solid solution in which a part of niobium and potassium of potassium niobate is replaced with other elements. As the potassium niobate solid solution, for example, a potassium sodium niobate tantalate solid solution expressed by $K_{1-x}Na_xNb_{1-y}Ta_yO_3$ (0<x<1, 0<y<1) can be enumerated. The same similarly applies to a second embodiment to be described below.

1.2. Next, a method for manufacturing the potassium niobate deposited body 100 is described.

(1) First, as shown in FIG. 1, a first substrate composed of an R-plane sapphire substrate (hereafter also referred to as an "R-plane sapphire substrate") 11 is prepared. The R-plane sapphire substrate 11 has been degreased and washed beforehand. Degreasing and washing can be conducted by soaking the R-plane sapphire substrate 11 in an organic solvent with an ultrasonic washing machine. The organic solvent is not particularly limited, but may be, for example, a mixed solution of ethyl alcohol and acetone.

(2) Next, a buffer layer 12 that consists of MgO is formed on the R-plane sapphire substrate 11 by a laser ablation method, as shown in FIG. 1.

More specifically, after the R-plane sapphire substrate 11 that has been degreased and washed is loaded onto a substrate holder, it is introduced together with the substrate holder in a vacuum apparatus whose back pressure at room temperature is $1\times10^{-7}$ Torr. Next, oxygen gas is introduced such that the oxygen partial pressure becomes $5\times10^{-5}$ Torr, for example, and then the substrate is heated to elevate its temperature to 400° C. at a rate of 20° C./minute with an infrared ray lamp. It is noted that the conditions such as the rate of temperature elevation, substrate temperature, pressure, etc. are not limited to the above.

Next, a plume is generated by a laser ablation method in which a laser beam is irradiated to a magnesium target for a buffer layer, thereby pounding out magnesium atoms from the target. Then, this plume is irradiated toward the R-plane sapphire substrate 11, and brought in contact with the R-plane sapphire substrate 11. As a result, a buffer layer 12 composed of MgO with a (100) orientation in a cubic system expression is formed by epitaxial growth on the R-plane sapphire substrate 11. The buffer layer 12 has the characteristics of the crystalline structure described above.

The thickness of the buffer layer 12 is not particularly limited, but may be 5 nm or more but 100 nm or less, in view of preventing the R-plane sapphire substrate 11 and the potassium niobate layer 14 from reacting each other, and preventing the potassium niobate layer 14 from becoming deteriorated due to the deliquescence of magnesium oxide itself.

As the method to pound out magnesium atoms or desired atoms from a target in a later step, besides the method of irradiating a laser beam to a target surface described above, for example, a method of irradiating (injecting) argon gas (inert gas) plasma or an electron beam to a target surface can also be used. However, the method of irradiating a laser beam to a target surface is desirable among them. According to such a method, atoms can be readily and securely pounded out from a target, with a vacuum apparatus having a simple structure equipped with an incident window of a laser beam.

The laser beam to be irradiated to a target may preferably be a pulsed beam with a wavelength of about 150-300 nm, and a pulse length of about 1-100 ns. More specifically, the laser beam may be, for example, an excimer laser such as an ArF excimer laser, a KrF excimer laser, a XeCl excimer laser, or the like, a YAG laser, a YVO$_4$ laser, a CO$_2$ laser or the like. Among the above, the ArF excimer laser and the KrF excimer laser are particularly preferred. The ArF excimer laser and the KrF excimer laser are easy to handle, and can effectively pound out atoms from a target.

Each of the conditions at the time of laser beam irradiation is not particularly limited as long as the plume can sufficiently reach the substrate 11, and MgO as the buffer layer 12 can be epitaxially grown. The conditions at the time of laser beam irradiation may be as follows. For example, the energy density of the laser beam may preferably be between 2 J/cm$^2$ and 3 J/cm$^2$. The frequency of the laser beam may preferably be between 5 Hz and 20 Hz. The distance between the target and the substrate 11 (hereafter referred to as the "target-to-substrate distance") may preferably be between 30 mm and 100 mm. The temperature of the substrate may preferably be between 400° C. and 600° C. The partial pressure of oxygen during deposition may preferably be between $1 \times 10^{-5}$ Torr and $1 \times 10^{-3}$ Torr.

(3) Then, as shown in FIG. 1, a lead zirconate titanate niobate layer 13 is formed on the buffer layer 12 by coating a precursor composition on the buffer layer 12 and heat treating the same. It is noted here that the method of coating the precursor composition is not particularly limited, and a known coating method, such as, for example, a spin coat method, a dipping method or the like can be used. Also, the heat treatment may include a heat treatment for crystallizing at least the precursor composition. The heat treatment is not particularly limited, and a known method, such as, for example, a rapid thermal anneal (RTA) method or the like can be used.

The precursor composition includes a precursor for forming lead zirconate titanate niobate. The precursor includes at least niobium, titanium and zirconium, and partially includes ester bonds. The precursor is dissolved or dispersed in an organic solvent. As the organic solvent, alcohol may be used. Any alcohol can be used without any particular limitation, and monovalent alcohols such as buthanol, methanol, ethanol, propanol, and the like, and polyhydric alcohols can be enumerated. For example, the following can be enumerated as the alcohols.

Monovalent Alcohols:
As propanol (propyl alcohol), 1-propanol (97.4° C. in boiling point), and 2-propanol (82.7° C. in boiling point);

As buthanol (butyl alcohol), 1-buthanol (117° C. in boiling point), 2-buthanol (100° C. in boiling point), 2-methyl-1-propanol (108° C. in boiling point), and 2-methyl-2-propanol (25.4° C. in melting point and 83° C. in boiling point); and As pentanol (amyl alcohol), 1-pentanol (137° C. in boiling point), 3-methyl-1-buthanol (131° C. in boiling point), 2-methyl-1-buthanol (128° C. in boiling point), 2,2-dimetyl-1-propanol (113° C. in boiling point), 2-pentanol (119° C. in boiling point), 3-methyl-2-buthanol (112.5° C. in boiling point), 3-pentanol (117° C. in boiling point), and 2-methyl-2-buthanol (102° C. in boiling point).

Polyhydric Alcohols:
Ethylene glycol (–11.5° C. in melting point, 197.5° C. in boiling point), and glycerin (17° C. in melting point, 290° C. in boiling point).

With the precursor composition used in the present embodiment, the precursor has ester-bonds by esterification of a polycarboxylic acid and metal alkoxides and is capable of a reversible reaction, such that the polymerized precursor can be decomposed to form metal alkoxides. For this reason, the metal alkoxides can be reused as precursor raw materials.

In addition, the precursor composition used in the present invention provides the following advantages. Lead acetate is generally used as a lead material in PZT sol-gel solutions that are commercially sold. However, lead acetate is difficult to bond with other alkoxide of Ti, Zr or the like, and difficult for lead to be taken into networks of the precursor. In contrast, according to the present embodiment, as described in greater detail below, networking of lead in the precursor, which was difficult so far, becomes easy, and therefore networks (precursor) that take in lead can be included. For this reason, the precursor composition used in the present embodiment has a higher composition controllability compared to a conventional sol-gel raw material, and can prevent lead vacancies in PZTN.

For example, succinic acid that is polycarboxylic acid with a valence of 2 is taken as an example to describe the above-described characteristics. Of the two carboxyl groups of succinic acid, a first one of the carboxyl groups, which initially works as an acid, has an acidity of pH=4.0, which is smaller than pH=4.56 of acetic acid, and therefore is a stronger acid than acetic acid, such that lead acetate bonds with succinic acid. In other words, weak acidic salt+strong acid becomes strong acidic salt+weak acid. Further, the remaining second carboxyl group of succinic acid bonds with other MOD molecules or alkoxide, such that networking of lead in the precursor becomes easy.

The precursor composition used in the present embodiment can be obtained in the following manner.

The precursor composition can be obtained by mixing a sol-gel raw material including a hydrolysis-condensation product of metal alkoxides, polycarboxylic acid or polycarboxylic acid ester, and an organic solvent. The sol-gel raw material includes at least niobate, titanium and zirconium. The precursor composition obtained in this manner includes a precursor having ester bonds by esterification of the polycarboxylic acid or polycarboxylic acid originated from the polycarboxylic acid ester and the metal alkoxides.

Figure 28:
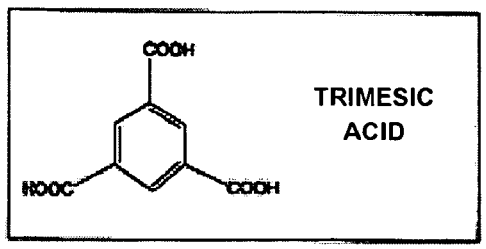
FIG. 28 is a diagram showing a precursor generating reaction in a precursor composition that is used in the first embodiment.
Figure 28:
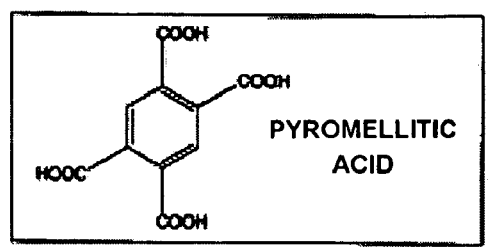
Figure 28:
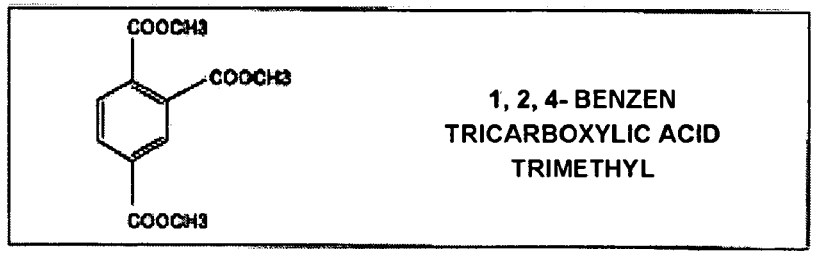
Figure 28:
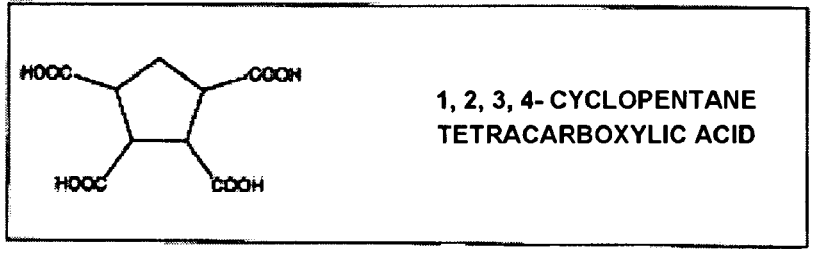
Figure 28:
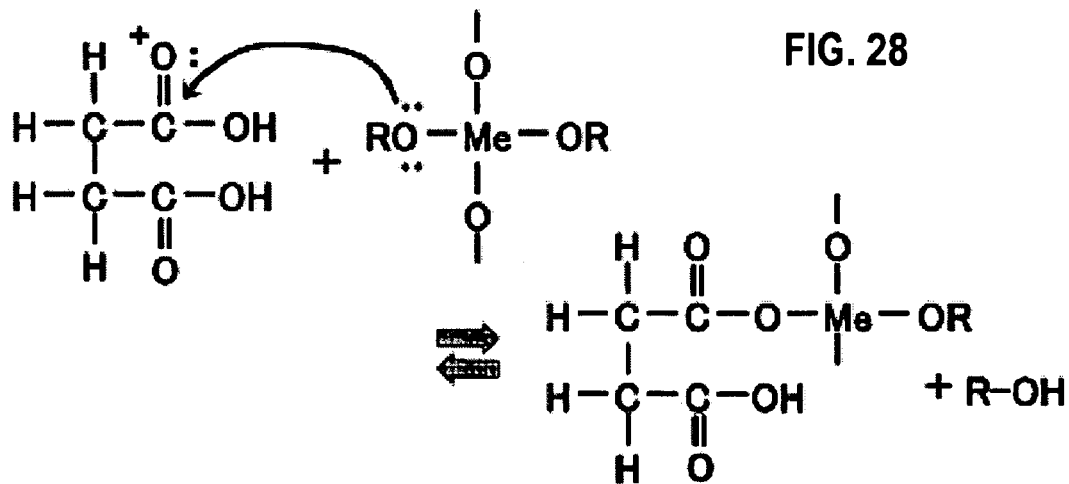
Figure 29:
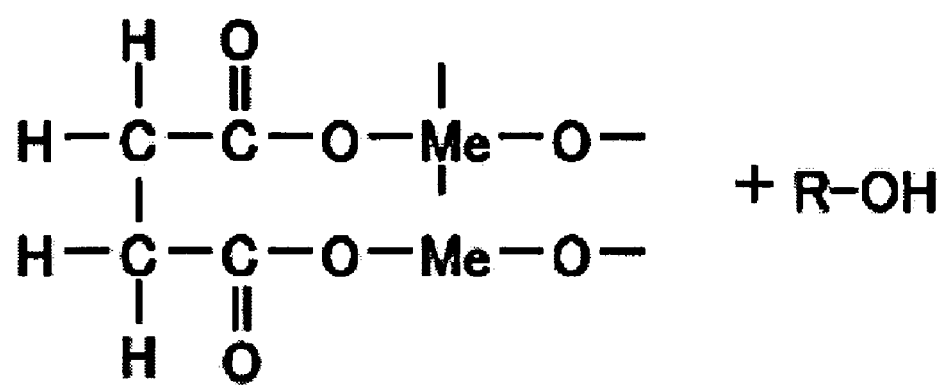
FIG. 29 is a diagram showing a precursor generating reaction in a precursor composition that is used in the first embodiment.

FIG. 28 and FIG. 29 schematically show a precursor generation reaction in accordance with the manufacturing method of the present embodiment.

The precursor generation reaction roughly includes an alkoxy group substitution reaction in a first stage shown in FIG. 28, and a polymer network forming reaction by esterification in a second stage shown in FIG. 29. FIGS. 28 and 29 show an example in which dimethyl succinate is used expediently as polycarboxylic acid ester, and n-buthanol is used as an organic solvent. Dimethyl succinate is of nonpolarity, but dissociates in alcohol and becomes dicarboxylic acid.

In the reaction in the first stage, as shown in FIG. 28, by esterification of dimethyl succinate and metal alkoxide of the sol-gel raw material, they are ester-bonded together. More specifically, dimethyl succinate dissociates in n-buthanol, and becomes to have a state in which proton is added to one of carbonyl groups (the first carbonyl group). A substitution reaction of the alkoxy group of the metal alkoxide with the first carbonyl group occurs, and a reaction product in which the first carboxyl group is esterified and alcohol are generated. It is noted here that the "ester-bond" means a bond between a carbonyl group and an oxygen atom (—COO—).

In the reaction in the second stage, as shown in FIG. 29, a substitution reaction between the other carboxyl group that remains in the reaction in the first stage (the second carboxyl group) and the alkoxy group of the metal alkoxide occurs, and a reaction product in which the second carboxyl group is esterified and alcohol are generated.

In this manner, by the reactions in two stages, a polymer network in which hydrolysis-condensation products of the metal alkoxides included in the sol-gel raw material are mutually ester-bonded is obtained. Therefore, this polymer network has ester-bonds in the network in a moderately orderly fashion. It is noted that dimethyl succinate dissociates in two stages, and the first carboxyl group has an acid dissociation constant that is larger than that of the second carboxyl group, such that the reaction in the first stage has a reaction rate greater than that of the reaction in the second stage. Accordingly, the reaction in the second stage advances more slowly than the reaction in the first stage.

In the present embodiment, the following methods can be used to promote the esterification reaction described above.

(a) The concentration or the reactivity of reaction product is increased. Concretely, by increasing the temperature of the reaction system, the degree of dissociation of polycarboxylic acid or polycarboxylic acid ester is increased, thereby increasing the reactivity. The temperature of the reaction system depends on the boiling point of an organic solvent, and is preferably be higher than room temperature, but lower than the boiling point of the organic solvent. The temperature of the reaction system may preferably be, for example, 100° C. or lower, and more preferably, 50-100° C.

(b) Reaction vice-generative products are removed. Concretely, water and alcohol generated with esterification are removed whereby the esterification further advances.

(c) Molecular motions of reaction products are physically accelerated. Concretely, energy rays, such as, for example, ultraviolet rays may be irradiated to increase the reactivity of the reaction products.

The organic solvent that may be used in the method for manufacturing a precursor composition in accordance with the present embodiment can be one of the alcohols described above. When alcohol is used as the solvent, both of the sol-gel raw material and polycarboxylic acid or polycarboxylic acid ester can be dissolved well.

The amount of polycarboxylic acid or(polycarboxylic acid ester to be used depends on the sol-gel raw materials and the composition ratio of PZTN. For example, the total mol ion concentration of a PZT sol-gel raw material, a PbNb sol-gel raw material and a PbSi sol-gel raw material, and the mol ion concentration of polycarboxylic acid, when the polycarboxylic acid bonds, may preferably satisfy 1≦(the mol ion concentration of polycarboxylic acid)/(the total mol ion concentration of the raw material solution), and more preferably be 1:1. The amount of polycarboxylic acid to be added can be, for example, 0.35 mol.

In other words, the amount of polycarboxylic acid or polycarboxylic acid ester to be added may preferably be equal to or greater than the total mol number of the raw material solutions to be bonded. All of the raw materials bond when the ratio of mol ion concentrations of the two is 1:1. However, because ester stably exists in an acidic solution, polycarboxylic acid may preferably be added in an amount greater than the total mol number of the raw material solutions such that ester can stably exist. It is noted here that the mol number of polycarboxylic acid or polycarboxylic acid ester is a mol ion concentration obtained by dividing the mol number by the valence. In other words, in the case of polycarboxylic acid or polycarboxylic acid ester with a valence of 2, one molecule of polycarboxylic acid or polycarboxylic acid ester can bond with two molecules of the raw material molecules. Therefore, in the case of polycarboxylic acid or polycarboxylic acid ester with a valence of 2, one mol of the material solution and 0.5 mol of polycarboxylic acid or polycarboxylic acid ester make the ratio of 1:1.

In addition, polycarboxylic acid or polycarboxylic acid ester may not initially be an acid, but ester of polycarboxylic acid may be dissociated in alcohol, thereby becoming polycarboxylic acid. In this case, alcohol to be added may preferably satisfy 1≦(the mol number of the alcohol/the mol number of polycarboxylic acid ester). This is because, the greater the mol number of alcohol, the more the entire polycarboxylic acid ester sufficiently, stably dissociates. It is noted here that the mol numbers of alcohol and polycarboxylic acid ester are so-called mol ion concentrations obtained by dividing the mol number of the alcohol and the mol number of the polycarboxylic acid ester by their valences, respectively.

In the method for manufacturing a precursor composition, the polycarboxylic acid or the polycarboxylic acid ester may have a valence of 2 or more. The following can be enumerated as the polycarboxylic acids.

As carboxylic acids with a valence of 3, trans-aconitic acid and trimesic acid can be enumerated; and as carboxylic acids with a valence of 4, pyromellitic acid, 1,2,3,4-cyclopentane tetracarboxylic acid and the like can be enumerated. Moreover, as polycarboxylic acid esters that dissociate in alcohol and work as polycarboxylic acid, those with a valence of 2 include dimethyl succinate, diethyl succinate, dibutyl oxalate, dimethyl malonate, dimethyl adipate, dimethyl maleate, and diethyl fumarate, those with a valence of 3 include tributyl citrate, 1,1,2-ethane tricarboxylic acid triethyle, and the like, and those with a valence of 4 include 1,1,2,2-ethane tetracarboxylic acid tetraethyl, 1,2,4-benzen tricarboxylic acid trimethyl, and the like.

These polycarboxylic acid esters enumerated above dissociate in alcohol and work as polycarboxylic acid. Examples of the polycarboxylic acids or their esters are shown in FIGS. 27A-27D. Also, the precursor composition used in the present embodiment may be characterized in linking networks through esterification by using polycarboxylic acid. Ester networks do not grow with monocarboxylic acids or their esters, such as, for example, acetic acid, methyl acetate or the like.

In the method for manufacturing a precursor composition, the carboxylic acid ester with a valence of 2 may be at least one kind selected from ester succinate, ester maleate, and ester malonate. As concrete examples of these esters, dimethyl succinate, dimethyl maleate, and dimethyl malonate can be enumerated.

The molecular weight of polycarboxylic acid ester may be 150 or less. When the molecular weight of polycarboxylic acid ester is too large, the film might be damaged easily when ester volatilizes at the time of heat-treatment, and a dense film may not be obtained. The polycarboxylic acid ester may preferably be in a liquid state in room temperature. This is because the liquid might gel if polycarboxylic acid ester is in a solid state at room temperature.

In the method for manufacturing a precursor composition, a sol-gel raw material using metal carboxylate may be further included when mixing the sol-gel raw material, the polycarboxylic acid or the polycarboxylic acid ester and the organic solvent. As the metal carboxylate, typically, lead acetate that is carboxylate of lead, and further, lead octylate, niobium octylate and lead niobium octylate shown in FIG. 26 can be enumerated.

In the method for manufacturing a precursor composition, an organic metal compound (MOD raw material) may be further included when mixing the sol-gel raw material, the polycarboxylic acid or the polycarboxylic acid ester and the organic solvent. In this manner, in the method for manufacturing a precursor composition, alkoxide raw materials not only can be mutually ester-bonded, but MOD raw material and alkoxide raw material can also be ester-bonded.

Figure 26:
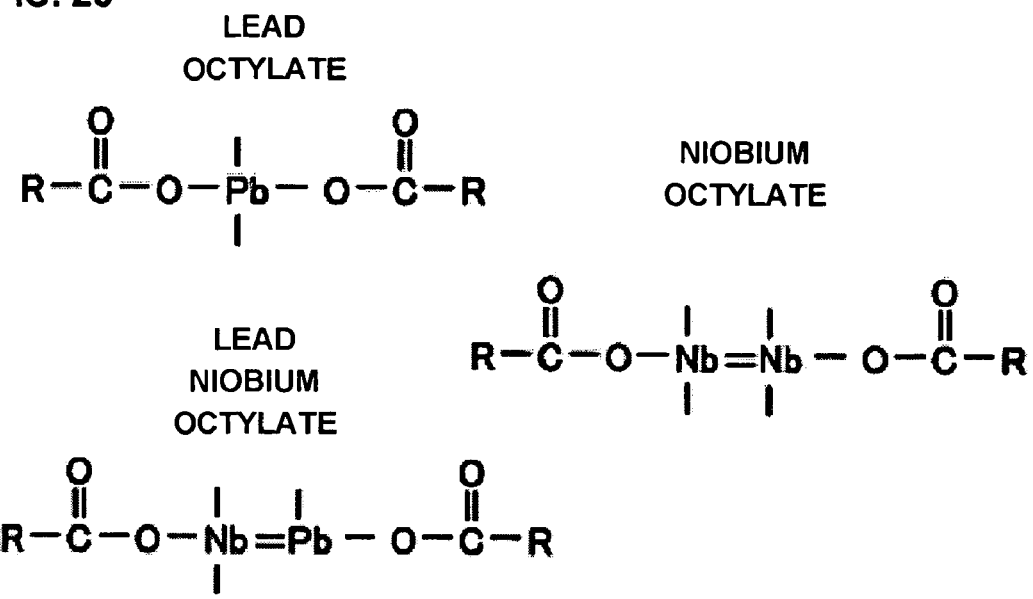
FIG. 26 shows carboxylic acids including lead, which are used in the first embodiment.
Figure 27A:
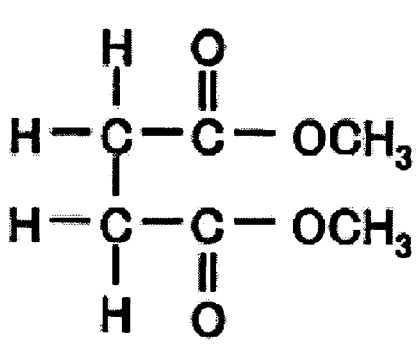
FIG. 27A shows polycarboxylic acid or polycarboxylic acid ester, which are used in the first embodiment.
Figure 27A:
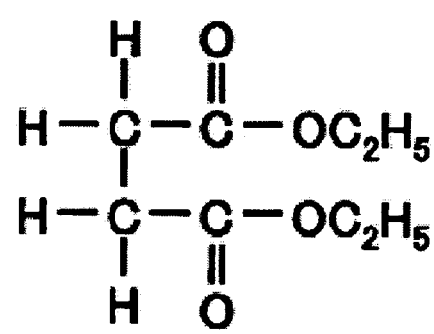
Figure 27C:
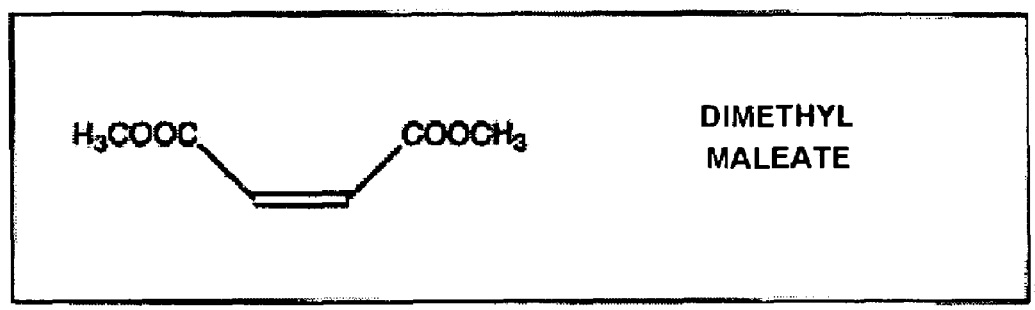
FIG. 27C shows polycarboxylic acid or polycarboxylic acid ester, which are used in the first embodiment.
Figure 27C:
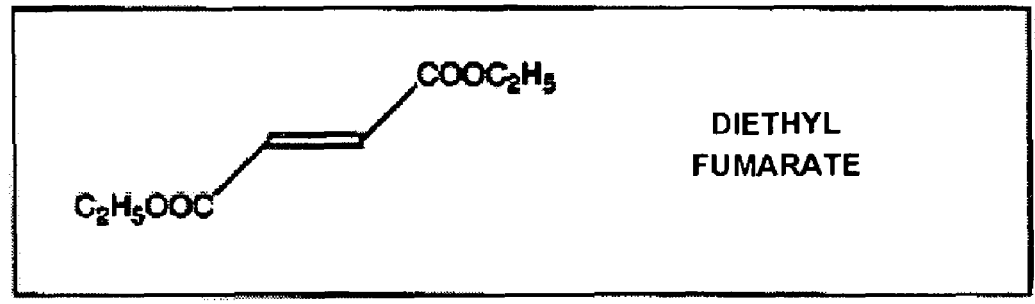
Figure 27C:
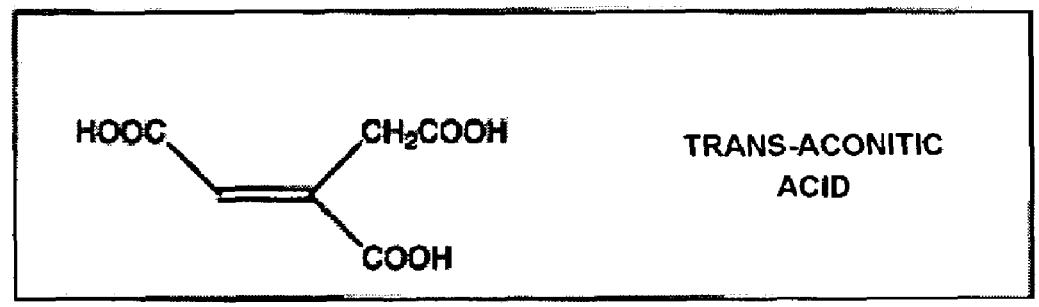

As the organic metal compound, for example, niobium octylate can be used. As shown in FIG. 26, niobium octylate has a structure in which two Nb atoms covalently bond together and octyl groups are present at other portions thereof. In this case, although two atoms Nb—Nb are bonded together, no other network is present, and therefore this is treated as an MOD raw material.

Network formation of carboxylic acid and an MOD raw material progresses mainly through alcohol exchange reaction. For example, in the case of niobium octylate, a reaction takes place between carboxylic acid and octyl groups (alcohol exchange reaction), whereby esterification of R—COO—Nb progresses. In this manner, in accordance with the present embodiment, the MOD raw material is esterified, thereby causing condensation of the MOD raw material and alkoxides, such that molecules of the MOD raw material can be bonded to the network of the precursor.

In the method for manufacturing a precursor composition, as the sol-gel raw material, a mixture of at least a sol-gel solution for $PbZrO_3$, a sol-gel solution for $PbTiO_3$ and a sol-gel solution for $PbNbO_3$ can be used. For example, the sol-gel solution for $PbZrO_3$ may be formed by mixing lead octylate and niobium octylate, and lead niobium octylate (see FIG. 26) obtained through alcohol exchange reaction of the two can be used.

Further, in the method for manufacturing a precursor composition, a sol-gel raw material including silicon or silicon and germanium can be used as a sol-gel raw material including hydrolysis-condensation product of a metal alkoxide. By adding these sol-gel raw materials, the crystallization temperature can be lowered, as described above. As such a sol-gel solution, either a sol-gel solution for $PbSiO_3$ alone or a sol-gel solution for $PbSiO_3$ and a sol-gel solution for $PbGeO_3$ together can be used. By using a sol-gel raw material including silicon and germanium, the film forming temperature can be lowered, and crystallization of PZTN at around 450° C. becomes possible.

Because the precursor of the precursor composition moderately has ester-bonds in plural molecular networks, the precursor can have a reversible reaction. Accordingly, by advancing a reaction in a leftward direction indicated in FIG. 28 in the precursor, the polymerized precursor (polymer network) can be decomposed into condensates of metal alkoxides.

(4) Next, as shown in FIG. 1, a potassium niobate layer 14 is formed by a laser ablation method on the lead zirconate titanate niobate layer 13.

Concretely, a plume is generated by a laser ablation method in which a laser beam is irradiated to a target for potassium niobate, for example, a $K_{0.6}Nb_{0.4}O_y$, target, thereby pounding out potassium, niobium and oxygen atoms from this target. Then, the plume is irradiated toward the R-plane sapphire substrate 11, and brought in contact with the lead zirconate titanate niobate layer 13. As a result, a potassium niobate layer 14 in a (100) orientation in a pseudo cubic system expression is formed by epitaxial growth on the lead zirconate titanate niobate layer 13.

The conditions of the laser ablation method are not particularly limited as long as the plume can sufficiently reach the lead zirconate titanate niobate layer 13. The conditions at the time of laser beam irradiation may be as follows. For example, the energy density of the laser beam may preferably be between 1 $J/cm^2$ and 3 $J/cm^2$. The frequency of the laser beam may preferably be between 5 Hz and 20 Hz. The target-to-substrate distance may preferably be between 30 mm and 100 mm. The temperature of the substrate may preferably be between 600° C. and 800° C. The partial pressure of oxygen during deposition may preferably be between $1\times10^{-2}$ Torr and 1 Torr.

In the present embodiment, by selecting each of the conditions at the time of laser ablation, pottasium niobate can be formed in single crystal or polycrystal (preferably polycrystal in a single phase).

In the above-described example, a $K_{0.6}Nb_{0.4}O_y$ target is used. However, the composition ratio of the target is not limited to the above. For example, for the formation of the potassium niobate layer 14, it is possible to use a target having a composition ratio that is suitable for conducting a Tri-Phase-Epitaxy method. Tri-Phase-Epitaxy method is a method in which a vapor phase raw material is deposited on a substrate that is maintained at temperatures in a solid-liquid coexisting region, and a solid phase is precipitated from a liquid phase.

Concretely, a plume that is a raw material in a vapor phase is supplied to a base substrate (which, in this embodiment, consists of the substrate 11, the buffer layer 12 and the lead zirconate titanate niobate layer 13) such that the mole composition ratio x of potassium in $K_xNb_{1-x}O_y$ in the state of a liquid phase immediately after being deposited on the base substrate is in the range of $0.5 \leq x \leq x_E$. It is noted that $x_E$ is a mole composition ratio x at an eutectic point of $KNbO_3$ and $3K_2O\cdot Nb_2O_5$ under a predetermined oxygen partial pressure. Then, by maintaining the temperature $T_s$ of the base substrate within the range of $T_E \leq T_s \leq T_m$, the remaining liquid of $K_xNb_{1-x}O_y$ deposited on the base substrate supplied from the plume is evaporated. By this, $KNbO_3$ single crystal can be precipitated from $K_xNb_{1-x}O_y$ on the base substrate. It is noted that $T_E$ is a temperature at an eutectic point of $KNbO_3$ and $3K_2O\cdot Nb_2O_5$ under a predetermined oxygen partial pressure. Also, $T_m$ is a complete melting temperature under a predetermined oxygen partial pressure of $K_xNb_{1-x}O_y$ in the state of a liquid phase immediately after being deposited on the base substrate.

By the steps described above, a potassium niobate deposited body 100 shown in FIG. 1 can be formed.

Further, a polishing process to planarize the surface of the potassium niobate layer 14 can be conducted if necessary. Buff polishing, CMP (Chemical Mechanical Polishing) or the like can be conducted as the polishing process.

It is noted that, in the present embodiment, a laser ablation method is used as a film forming method for forming the buffer layer 12 and the potassium niobate layer 14. However, the film forming method is not limited to this method, and, for example, a vapor deposition method, a MOCVD method, and a sputter method can be used.

1.3. According to the present embodiment, a buffer layer 12 composed of MgO in a cubic (100) orientation is formed on a R-plane sapphire substrate 11 by using a vapor phase method, a lead zirconate titanate niobate layer 13 is formed on the buffer layer 12 by using a liquid phase method, and a potassium niobate layer 14 is further formed on the lead zirconate titanate niobate layer 13 by using a vapor phase method. By this, the potassium niobate layer 14 in a single phase thin film can be epitaxially grown. By using the potassium niobate layer 14, a surface acoustic wave element having a high electromechanical coupling coefficient can be obtained, as described below.

Furthermore, in accordance with the present embodiment, a (100) plane of the potassium niobate layer 14 tilts with a [11-20] direction vector as a rotation axis with respect to the R-plane (1-102) of the R-plane sapphire substrate 11. By using the potassium niobate layer 14, a surface acoustic wave element having a higher electromechanical coupling coefficient can be obtained, as described below.

Furthermore, according to the present embodiment, by forming the lead zirconate titanate niobate layer 13 on the buffer layer 12, the surface morphology of the potassium niobate layer 14 can be improved. In other words, the lead zirconate titanate niobate layer 13 obtained in the present embodiment excels in the surface morphology and nonconductivity, and is formed in a film on the buffer layer 12 by epitaxial growth, such that the crystalline characteristics of the potassium niobate layer 14 can be further improved in a state where the crystalline orientation controllability of the buffer layer 12 is maintained.

In the present embodiment, the mechanism as to how the lead zirconate titanate niobate (PZTN) layer 13 described above is obtained is not necessarily clear, but is believed to be greatly influenced by the precursor composition as described below.

In the precursor composition, a polymer network in which hydrolysis-condensation products (plural molecular networks) of the metal alkoxides included in the sol-gel raw materials are mutually condensation-polymerized by polycarboxylic acid through ester-bonds can be obtained. Therefore, this polymer network moderately has ester-bonds among the multiple molecular networks originated from the aforementioned hydrolysis-condensation products. Further, the esterification reaction can be readily conducted by temperature control.

Because the precursor composition moderately has esterbonds in plural molecular networks, as described above, the precursor composition can have a reversible reaction. Accordingly, among the compositions remaining after the PZTN film has been formed, the polymerized precursor (polymer networks) can be decomposed to form metal alkoxides (or molecular networks composed of condensates thereof). Such metal alkoxides (or molecular networks composed of condensates thereof) can be reused as precursor raw material, such that harmful substances such as lead can be reused, which is greatly advantageous from the viewpoint of the environment.

Furthermore, with the precursor composition of the present embodiment, networking of lead in the precursor, which was difficult so far, becomes easy, and networks (precursor) that take in lead can be included, such that the precursor composition has higher composition controllability.

1.4. FIRST EXPERIMENTAL EXAMPLE

Figure 4A:
FIGS. 4A-4C are RHEED patterns of a sapphire substrate, a buffer layer, and a KNbO$_3$ layer in accordance with a first exemplary embodiment, respectively.

First, a substrate 11 composed of an R-plane sapphire single crystal plate was degreased and washed through soaking the substrate 11 in an organic solvent with an ultrasonic washing machine. As the organic solvent, a 1:1 mixed solution of ethyl alcohol and acetone was used. After loading the substrate 11 onto a substrate holder, the substrate 11 was introduced together with the substrate holder in a vacuum apparatus whose back pressure at room temperature was $1 \times 10^{-7}$ Torr, oxygen gas was introduced such the oxygen partial pressure became $5 \times 10^{-5}$ Torr, and then the substrate was heated to elevate its temperature to 400° C. at a rate of 20° C./minute with an infrared ray lamp. At this time, as shown in FIG. 4A, a pattern obtained by the reflection high speed electron beam diffraction (i.e., reflection high energy electron diffraction: RHEED) in a sapphire [11-20] direction, diffraction patterns in streaks were observed.

Next, a pulsed beam of KrF excimer laser (with a wavelength of 248 nm) under conditions with an energy density being 2.5 J/cm², a frequency being 10 Hz and a pulse length being 10 ns was injected in a surface of a magnesium target, thereby generating a plasma plume of magnesium on the target surface. The plasma plume was irradiated to the substrate 11 under conditions with a substrate temperature being 400° C. and an oxygen partial pressure being $5 \times 10^{-5}$ Torr, whereby a buffer layer 12 consisting of MgO was formed thereon. The target-to-substrate distance was 70 mm, the irradiation time was 30 minutes, and the film thickness of the buffer layer 12 was 50 nm.

Figure 4B:
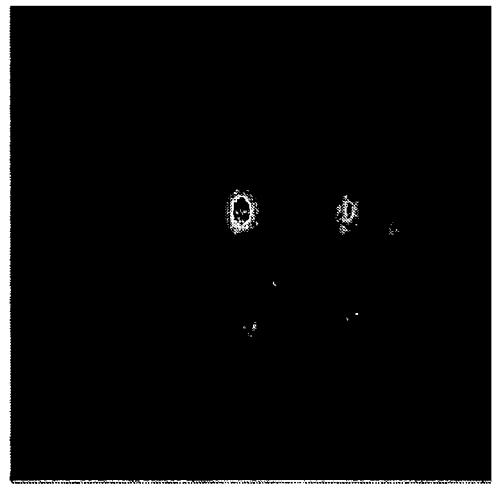

A RHEED pattern in a sapphire [11-20] direction of the deposited body thus obtained was investigated, and a pattern shown in FIG. 4B was obtained. A diffraction pattern appears in this RHEED pattern, and it was confirmed that the buffer layer 12 composed of MgO had undergone epitaxial growth.

Figure 5:
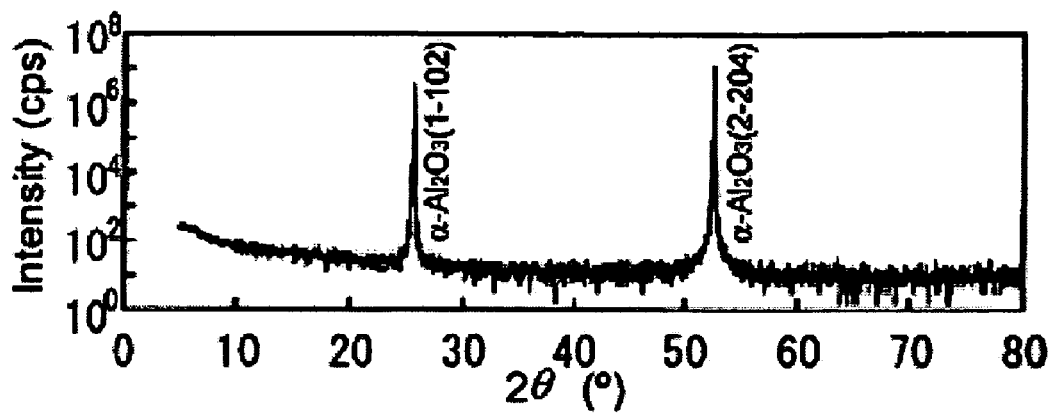
FIG. 5 is a 2θ-θ scanning X-ray diffraction diagram of the buffer layer in accordance with the first exemplary embodiment.
Figure 6:
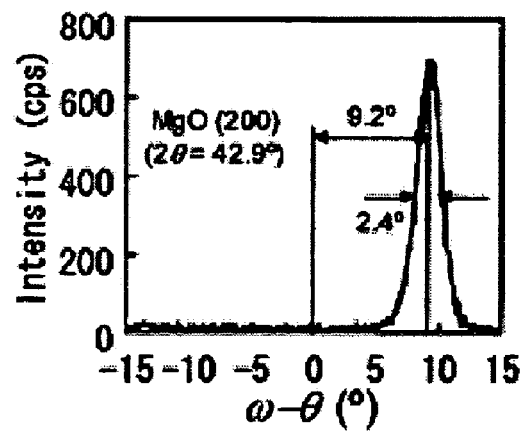
FIG. 6 is a ω scanning X-ray diffraction diagram of the buffer layer in accordance with the first exemplary embodiment.
Figure 7:
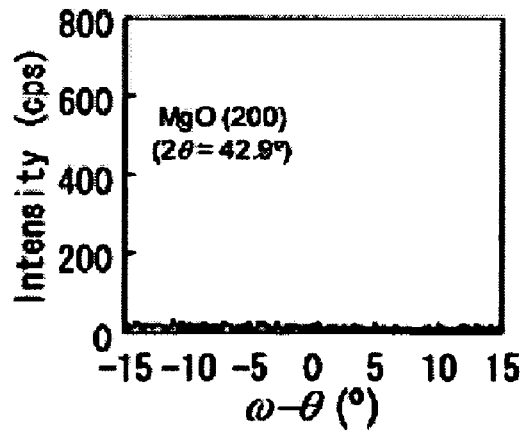
FIG. 7 is a ω scanning X-ray diffraction diagram of the buffer layer in accordance with the first exemplary embodiment.

Further, an X-ray diffraction pattern (2θ-θ scanning) of the buffer layer 12 composed of MgO in the deposited body is shown in FIG. 5. As shown in FIG. 5, no peak other than the peaks of the substrate 11 was observed. X-ray diffraction patterns (ω scanning) obtained when the value 2θ was fixed at MgO (200) (2θ=42.92° when a=0.4212 nm) are shown in FIG. 6 and FIG. 7. When the rotation axis of the ω scanning was in parallel with the sapphire [11-20], a peak shifted by 9.2° from the center was observed as shown in FIG. 6. When the rotation axis of the ω scanning was in parallel with the sapphire [-1101], no peak was observed, as shown in FIG. 7. Based on these results, it was confirmed that an MgO (100) film tilted by about 9° from the substrate 11 had undergone epitaxial growth.

Then, a precursor composition was coated on the buffer layer 12, and then heat treated to thereby form a lead zirconate titanate niobate layer 13.

In the present exemplary embodiment, the precursor composition was obtained in the following manner. The precursor composition was obtained by mixing first through third raw material liquids each containing at least one of Pb, Zr, Ti and Nb, dimethyl succinate as polycarboxylic acid ester, and n-buthanol as an organic solvent. The mixed solution was formed by dissolving the sol-gel raw material and the dimethyl succinate at a rate of 1:1 (in mol ion concentration) in the n-buthanol.

As the first raw material liquid, a solution in which a condensation polymer for forming $PbZrO_3$ perovskite crystal with Pb and Zr among the constituent metal elements of the PZTN was dissolved in the solvent of n-buthanol in an anhydrous state was used.

As the second raw material liquid, a solution in which a condensation polymer for forming $PbTiO_3$ perovskite crystal with Pb and Ti among the constituent metal elements of the PZTN was dissolved in the solvent of n-buthanol in an anhydrous state was used.

As the third raw material liquid, a solution in which a condensation polymer for forming $PbNbO_3$ perovskite crystal with Pb and Nb among the constituent metal elements of the PZTN ferroelectric phase was dissolved in the solvent of n-buthanol in an anhydrous state was used.

When a film composed of $PbZr_{0.2}Ti_{0.6}Nb_{0.2}O_3$ (PZTN) is to be obtained by using the first, second and third raw material liquids, they are mixed in a mixing ratio ((the first raw material liquid):(the second raw material liquid):(the third raw material liquid)) of 2:6:2. Moreover, for the purpose of lowering the crystallization temperature of the PZTN film, a solution in which a condensation polymer for forming $PbSiO_3$ crystal was dissolved in the solvent of n-buthanol in an anhydrous state was added by 3 mol % as a fourth raw material liquid to the above mixed solution. In other words, by using the mixed solution of the first, second, third and fourth raw material liquids as the sol-gel raw material, PZTN can be crystallized at crystallization temperatures at 700° C. or below.

A lead zirconate titanate niobate layer 13 was obtained by the following method.

First, at room temperature, a solution was prepared by dissolving the aforementioned first to fourth raw material liquids and dimethyl succinate in n-buthanol. Then, the solution was heated at 80° C. for 60 minutes to prepare a solution (precursor composition). Then, the solution was coated by a spin coat method on an R-plane sapphire substrate 11, and a drying treatment was conducted at 150-180° C. (150° C.), using a hot plate to thereby remove alcohol. Then, a cleaning thermal treatment was conducted using a hot-plate at 300-350° C. (300° C.). Then, the aforementioned coating step, drying treatment step, and cleaning thermal treatment were conducted multiple times according to the requirement to thereby obtain a coated film having a desired film thickness. Further, a PZTN film 12 having a film thickness of 150 nm was obtained by conducting crystallization annealing (sintering). The sintering for crystallization was conducted by using rapid thermal annealing (RTA) in an oxygen atmosphere at 650° C.-700° C. (700° C.).

Then, the sapphire substrate 11 with the buffer layer 12 and the lead zirconate titanate niobate layer 13 formed thereon was loaded onto a substrate holder, the sapphire substrate 11 was introduced together with the substrate holder in a vacuum apparatus whose back pressure at room temperature was $1 \times 10^{-7}$ Torr, oxygen gas was introduced such that the oxygen partial pressure became $5 \times 10^{-5}$ Torr, and then the substrate was heated to elevate its temperature to 400° C. at a rate of 20° C./minute with an infrared ray lamp.

Next, a pulsed beam of KrF excimer laser under conditions with an energy density being 2 $J/cm^2$, a frequency being 10 Hz and a pulse length being 10 ns was injected in a surface of a $K_{0.6}Nb_{0.4}O_y$ target, thereby generating a plasma plume of K, Nb and O on the target surface. The plasma plume was irradiated to the substrate 11 under conditions with a substrate temperature being 600° C. and an oxygen partial pressure being 0.5 Torr, whereby a potassium niobate layer 14 was formed on the lead zirconate titanate niobate layer 13. The target-to-substrate distance was 70 mm, the irradiation time was 240 minutes, and the film thickness of the potassium niobate layer 14 was 1 µm.

By the steps described above, a potassium niobate deposited body 100 (see FIG. 1) was obtained.

Figure 4C:

A RHEED pattern in a sapphire [11-20] direction of the deposited body thus obtained was investigated, and a pattern shown in FIG. 4C was obtained. A clear diffraction pattern appears in this RHEED pattern, and it was confirmed that potassium niobate had undergone epitaxial growth.

Figure 8:
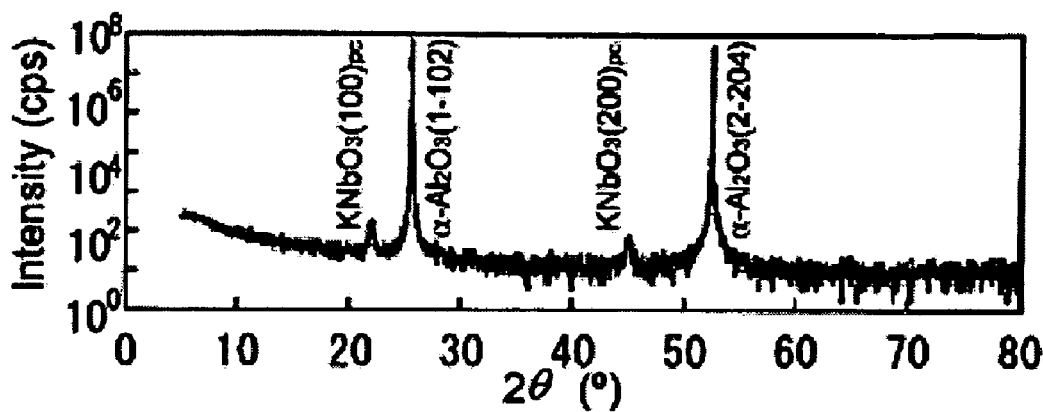
FIG. 8 is a 2θ-θ scanning X-ray diffraction diagram of the KNbO$_3$ layer in accordance with the first exemplary embodiment.
Figure 9:
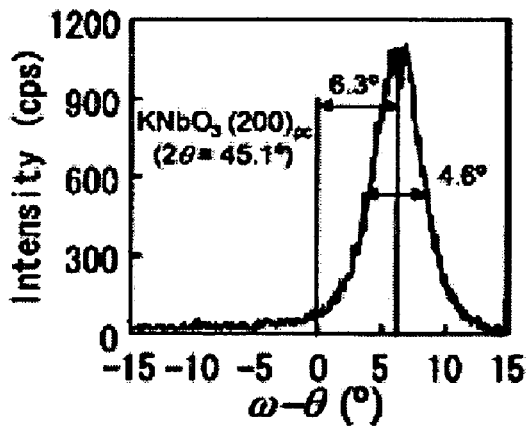
FIG. 9 is a ω scanning X-ray diffraction diagram of the KNbO₃ layer in accordance with the first exemplary embodiment.
Figure 10:
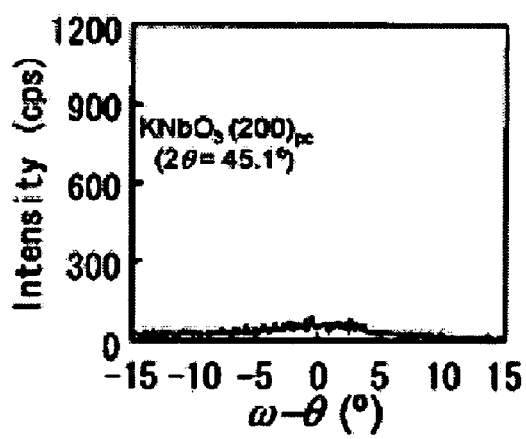
FIG. 10 is a ω scanning X-ray diffraction diagram of the KNbO₃ layer in accordance with the first exemplary embodiment.

Further, an X-ray diffraction pattern (2θ-θ scanning) of the potassium niobate ($KNbO_3$) layer 14 of the deposited body is shown in FIG. 8. As shown in FIG. 8, peaks of $KNbO_3$ $(100)_{pc}$, and $KNbO_3$ $(200)_{pc}$ were observed, as $KNbO_3$ is expressed by plane index of pseudo cubic. Accordingly, it was confirmed that $KNbO_3$ was oriented to $(100)_{pc}$. X-ray diffraction patterns (ω scanning) of $KNbO_3$ $(200)_{pc}$ (2θ=45.12°) are shown in FIG. 9 and FIG. 10. When the rotation axis of the ω scanning was in parallel with the sapphire [11-20], a peak shifted by 6.3° from the center was observed as shown in FIG. 9. When the rotation axis of the ω scanning was in parallel with the sapphire [-1101], no peak was observed, as shown in FIG. 10. Based on these results, it was confirmed that a $KNbO_3$ $(100)_{pc}$ film tilted by about 6° from the substrate 11 grew.

Figure 11:
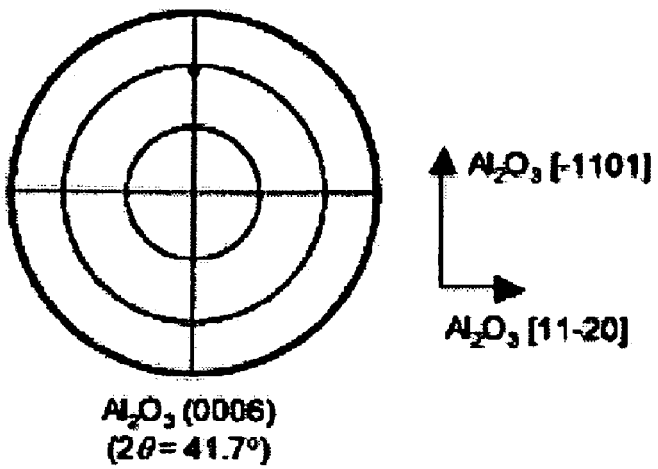
FIG. 11 is an X-ray diffraction pole figure of the sapphire substrate in accordance with the first exemplary embodiment.
Figure 12:
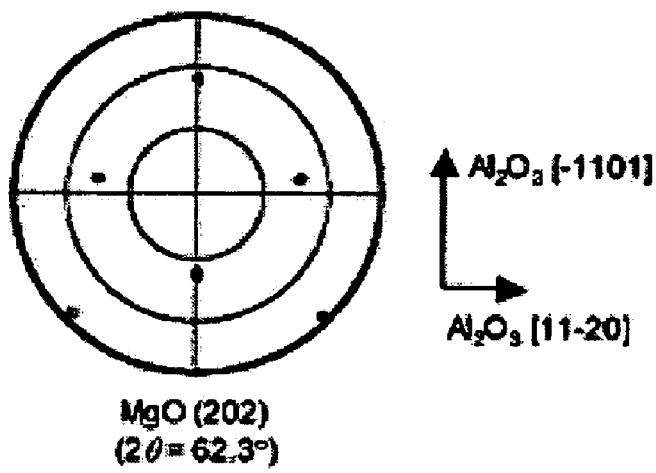
FIG. 12 is an X-ray diffraction pole figure of the buffer layer in accordance with the first exemplary embodiment.
Figure 13:
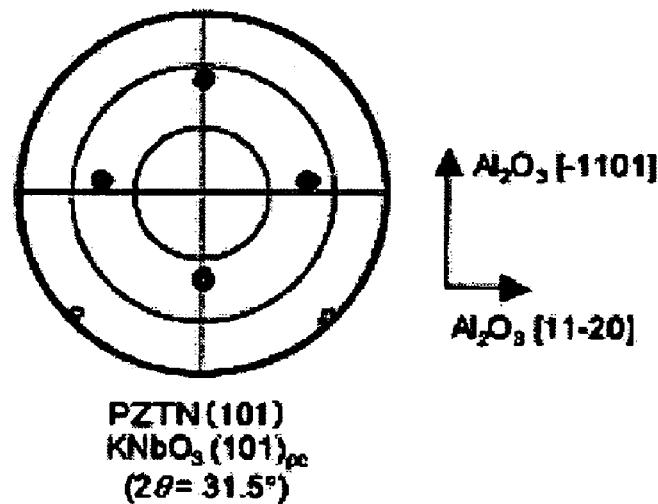
FIG. 13 is an X-ray diffraction pole figure of PZTN and KNbO₃ in accordance with the first exemplary embodiment.

Moreover, X-ray diffraction pole figures were investigated, and the results shown in FIG. 11-FIG. 13 were obtained. FIG. 11, FIG. 12 and FIG. 13 are X-ray diffraction pole figures of sapphire (0006) (2θ=41.7°), MgO (202) (2θ=62.3°), and PZTN (101) and $KNbO_3$ $(101)_{pc}$ (2θ=31.5°), respectively. It is noted that FIG. 13 shows the results of PZTN and $KNbO_3$. As shown in FIG. 12 and FIG. 13, spots of MgO (202), PZTN (101) and $KNbO_3$ $(101)_{pc}$ indicate symmetry four times, and it was found that orientations of epitaxial growth were in relation of $KNbO_3$ $(100)_{pc}$/PZTN (101)/MgO (100)/sapphire (1-102) in interplane, and $KNbO_3$ $[010]_{pc}$//PZTN [101]//MgO [010]//sapphire [11-20] in in-plane.

Also, as shown in FIG. 12 and FIG. 13, the centers of these four spots are shifted from the center of the pole figure (Psi=0 degree) in the sapphire [-1101] direction by about 9°, 6° and 6°, respectively. They coincide with the shift amounts in the ω scanning described above. Accordingly, it was confirmed that the buffer layer 12 composed of MgO epitaxially grew with its (100) plane tilted with a [11-20] direction vector as a rotation axis by about 9° with respect to the R-plane of the substrate 11, the lead zirconate titanate niobate layer 13 epitaxially grew with its (100) plane in a cubic system expression tilted with a [11-20] direction vector as a rotation axis by about 6° with respect to the R-plane of the substrate 11, and the potassium niobate layer 14 epitaxially grew with its (100) plane in a pseudo cubic system expression tilted with a [11-20] direction vector as a rotation axis by about 6° with respect to the R-plane of the substrate 11.

Figure 14:
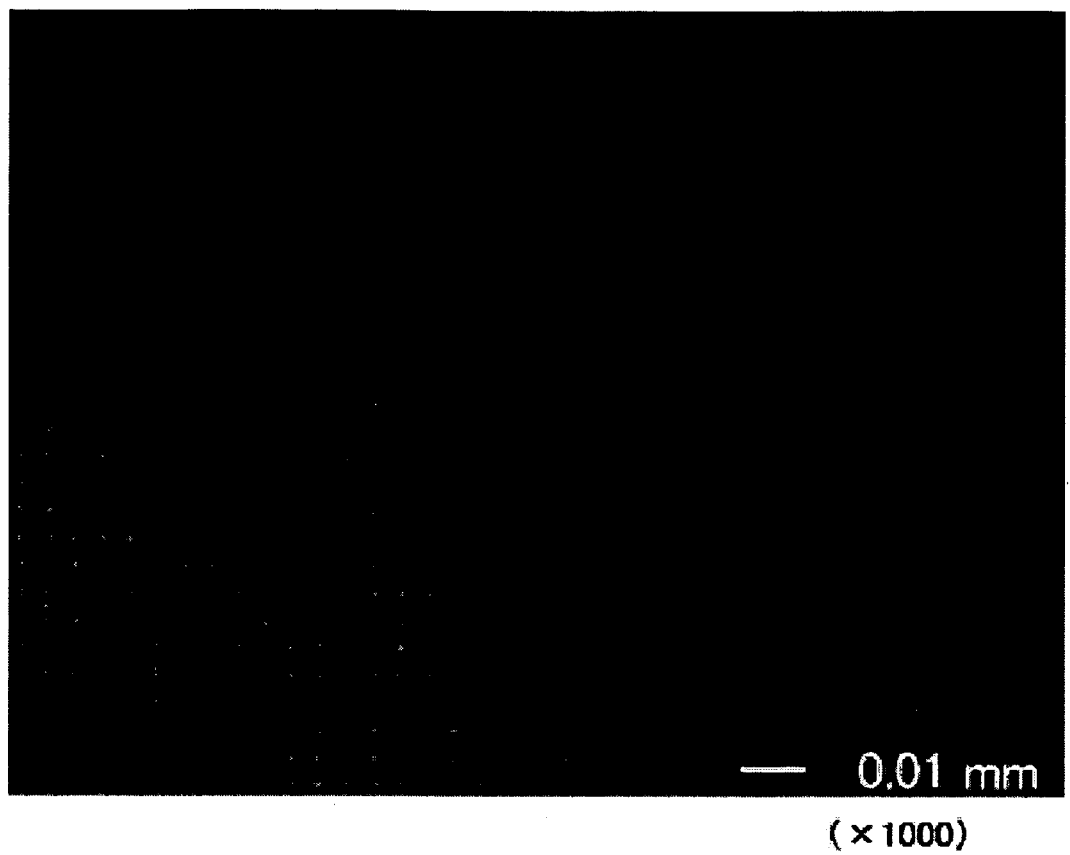
FIG. 14 is a microphotograph of a surface of the deposited body in accordance with the first exemplary embodiment.

Further, the surface of the deposited body 100 was observed by an optical microscope, and it was confirmed that its surface morphology was excellent, as shown in FIG. 14. Also, the deposited body 100 was transparent by visual observation. This means that the surface of the potassium niobate layer 14 is flat and its crystal grains are uniform.

Figure 15:
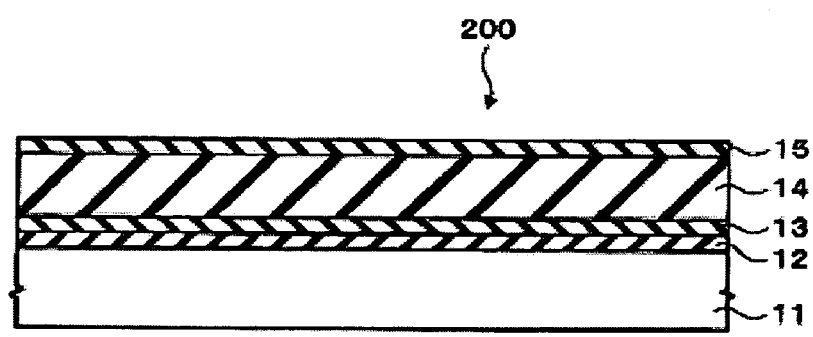
FIG. 15 is a cross-sectional view schematically showing a potassium niobate deposited body in accordance with a second embodiment.

2. Second Embodiment 2.1. FIG. 15 is a cross-sectional view schematically showing a potassium niobate deposited body 200 in accordance with an embodiment of the invention. The potassium niobate deposited body 200 of the present embodiment may include a substrate 11, a buffer layer 12 formed on the substrate 11, a first lead zirconate titanate niobate layer 13 formed on the buffer layer 12, a potassium niobate layer 14 formed on the first lead zirconate titanate niobate layer 13, and a second lead zirconate titanate niobate layer 15 formed on the potassium niobate layer 14. The present embodiment is different from the first embodiment in that the second lead zirconate titanate niobate layer 15 is further provided over the potassium niobate layer 14. Members that are similar to those of the potassium niobate deposited body 100 of the first embodiment are appended with the same reference numerals, and their detailed description shall be omitted.

An R-plane sapphire substrate may be used as the substrate 11, like the first embodiment.

As the buffer layer 12, a metal oxide having a rock salt structure, for example, MgO (magnesium oxide) can be used, like the first embodiment. The buffer layer 12 may preferably epitaxially grow in a (100) orientation in a cubic system expression, like the first embodiment. A (100) plane of the buffer layer 12 may preferably tilt with a [11-20] direction vector as a rotation axis with respect to the R-plane (1-102) of the R-plane sapphire substrate 11.

The first lead zirconate titanate niobate layer 13 epitaxially grows in a (100) orientation in a cubic system expression, like the first embodiment. A (100) plane of the lead zirconate titanate niobate layer 13 may tilt with the [11-20] direction vector as a rotation axis with respect to the R-plane (1-102) of the R-plane sapphire substrate 11.

Further, the first lead zirconate titanate niobate layer 13 may preferably include, as one of the characteristics of its composition, niobium in 5 mol % or greater, and more preferably, in 10 mol % or greater but 30 mol % or smaller with respect to niobium, titanium and zirconium, like the first embodiment. Also, the lead zirconate titanate niobate layer 13 of the present embodiment may preferably include silicon or silicon and germanium in 0.5 mol % or greater, and more preferably, 0.5 mol % or greater but 5 mol % or smaller.

The potassium niobate layer 14 epitaxially grows in a (100) orientation in a pseudo cubic system expression, like the first embodiment. Further, the (100) plane of the potassium niobate layer 14 may tilt with a [11-20] direction vector as a rotation axis with respect to the R-plane (1-102) of the R-plane sapphire substrate 11.

The potassium niobate layer 14 has potassium niobate in single crystal or polycrystal. The thickness of the potassium niobate layer 14 can be appropriately selected according to devices to which the potassium niobate deposited body is applied without any particular limitation, but may be, for example, 100 nm or greater but 10 μm or less.

The second lead zirconate titanate niobate layer 15 epitaxially grows in a (100) orientation in a cubic system expression, like the first lead zirconate titanate niobate layer 13. A (100) plane of the lead zirconate titanate niobate layer 13 may tilt with the [11-20] direction vector as a rotation axis with respect to the R-plane (1-102) of the R-plane sapphire substrate 11. The angle defined between the (100) plane of the second lead zirconate titanate niobate layer 15 and the R-plane (1-102) of the R-plane sapphire may preferably be 1 degree or greater but 15 degree or less.

Further, the second lead zirconate titanate niobate layer 15 may preferably include, as one of the characteristics of its composition, niobium in 5 mol % or greater, and more preferably, in 10 mol % or greater but 30 mol % or smaller with respect to niobium, titanium and zirconium, like the first lead zirconate titanate niobate layer 13. Also, the lead zirconate titanate niobate layer 17 of the present embodiment may preferably include silicon, or silicon and germanium in 0.5 mol % or greater, and more preferably, 0.5 mol % or greater but 5 mol % or smaller.

2.2. Next, a method for manufacturing the potassium niobate deposited body 200 is described.

(1) First, as shown in FIG. 15, a substrate composed of an R-plane sapphire substrate (hereafter also referred to as an "R-plane sapphire substrate") 11 is prepared, like the first embodiment.

(2) Next, as shown in FIG. 15, a buffer layer 12 composed of MgO is formed on the R-plane sapphire substrate 11 by a laser ablation method. The method for forming the buffer layer 12 is similar to that of the first embodiment.

(3) Then, a precursor composition is coated on the buffer layer 12, and then heat treated to thereby form a first lead zirconate titanate niobate layer 13, as shown in FIG. 15. The method for forming the first lead zirconate titanate niobate layer 13 is similar to that of the first embodiment.

(4) Next, as shown in FIG. 15, a potassium niobate layer 14 is formed on the lead zirconate titanate niobate layer 13 by a laser ablation method. The method for forming the potassium niobate layer 14 is similar to that of the first embodiment.

(5) Next, a second lead zirconate titanate niobate layer 15 is formed on the potassium niobate layer 14. The method for forming the lead zirconate titanate niobate layer 15 is similar to the method for forming the first lead zirconate titanate niobate layer 13 described in (3) above. More specifically, a precursor composition is coated on the potassium niobate layer 14, and then heat treated to thereby form the second lead zirconate titanate niobate layer 15. The second lead zirconate titanate niobate layer 15 is epitaxially grown due to the potassium niobate layer 14 below, and has the specified orientation described above.

By the steps described above, the potassium niobate deposited body 200 in which the buffer layer 12, the first lead zirconate titanate niobate layer 13, the potassium niobate layer 14 and the second lead zirconate titanate niobate layer 15 are successively laminated on the R-plane sapphire substrate 11 can be obtained.

It is noted that, in the present embodiment, a laser ablation method is used as a film forming method for forming the buffer layer 12 and the potassium niobate layer 14. However, the film forming method is not limited to this method, and, for example, a vapor deposition method, a MOCVD method, and a sputter method can be used.

According to the present embodiment, like the first embodiment, a buffer layer 12 composed of MgO in a cubic (100) orientation is formed on a R-plane sapphire substrate 11, a first lead zirconate titanate niobate layer 13 is formed on the buffer layer 12 by using a liquid phase method, a potassium niobate layer 14 is formed on the lead zirconate titanate niobate layer 13 by using a vapor phase method, and further a second lead zirconate titanate niobate layer 15 is formed by a liquid phase method. By this, the potassium niobate layer 14 in a single phase thin film can be epitaxially grown. By using the potassium niobate layer 14, a surface acoustic wave element having a high electromechanical coupling coefficient can be obtained, as described below.

In accordance with the present embodiment, a (100) plane of the potassium niobate layer 14 tilts with a [11-20] direction vector as a rotation axis with respect to the R-plane (1-102) of the R-plane sapphire substrate 11. By using the potassium niobate layer 14, a surface acoustic wave element having a higher electromechanical coupling coefficient can be obtained, as described below.

In accordance with the present embodiment, because the second lead zirconate titanate niobate layer 15 has excellent surface morphology and nonconductivity, for example, a conductive layer (electrode layer) having excellent interface state can be formed on the lead zirconate titanate niobate layer 15.

Furthermore, in accordance with the present embodiment, like the first embodiment, by forming the first lead zirconate titanate niobate layer 13 on the buffer layer 12, the surface morphology of the potassium niobate layer 14 can be improved. In other words, the lead zirconate titanate niobate layer 13 obtained in the present embodiment excels in surface morphology and nonconductivity, and is formed in a film on the buffer layer 12 by epitaxial growth, such that the crystalline characteristics of the potassium niobate layer 14 can be further improved in a state where the crystalline orientation controllability of the buffer layer 12 is maintained.

2.4. SECOND EXPERIMENTAL EXAMPLE

In the present experimental example, a potassium niobate deposited body 200 was formed in a manner similar to the first experimental example except that a second lead zirconate titanate niobate layer 15 is further firmed on the potassium niobate deposited body 100 obtained in the first experimental example. The second lead zirconate titanate niobate layer 15 was formed through forming a coated film using a precursor composition similar to the first exemplary embodiment, and conducting a heat treatment similar to the first exemplary embodiment. The lead zirconate titanate niobate layer 15 had a film thickness of 50 nm.

A RHEED pattern in a sapphire [11-20] direction of the deposited body 200 thus obtained was investigated, and a pattern similar to the pattern shown in FIG. 4C was obtained. A clear diffraction pattern appears in this pattern, and it was confirmed that potassium niobate had undergone epitaxial growth.

Further, an X-ray diffraction pattern (2θ-θ scanning) of the potassium niobate ($KNbO_3$) layer 14 in the deposited body 200 became similar to the pattern shown in FIG. 8. In other words, peaks of $KNbO_3$ $(100)_{pc}$, and $KNbO_3$ $(200)_{pc}$ were observed, as $KNbO_3$ of the present exemplary embodiment is expressed by plane index of pseudo cubic. Accordingly, it was confirmed that $KNbO_3$ was oriented to $(100)_{pc}$. Also, X-ray diffraction patterns (ω scanning) of $KNbO_3$ $(200)_{pc}$ (2θ=45.12°) were similar to the first exemplary embodiment. More specifically, when the rotation axis of the ω scanning was in parallel with the sapphire [11-20], a peak shifted by 6.3° from the center was observed as shown in FIG. 9. When the rotation axis of the ω scanning was in parallel with the sapphire [-1101], no peak was observed, as shown in FIG. 10. Based on these results, it was confirmed that a $KNbO_3$ $(100)_{pc}$ film tilted by about 6° from the substrate 11 grew.

Moreover, X-ray diffraction pole figures were investigated, and results similar to the results shown in FIG. 11-FIG. 13 were obtained. More specifically, it was found from the X-ray diffraction pole figures of sapphire (0006) (2θ=41.7°), MgO (202) (2θ=62.3°), and PZTN (101) and $KNbO_3$ $(101)_{pc}$ (2θ=31.5°), respectively, that spots of MgO (202), PZTN (101) and $KNbO_3$ $(101)_{pc}$ indicated symmetry four times, and that orientations of epitaxial growth were in relation of $KNbO_3$ $(100)_{pc}$/PZTN (101)/MgO (100)/sapphire (1-102) in inter-plane, and $KNbO_3$ $[010]_{pc}$//PZTN [101]// MgO [010]//sapphire [11-20] in in-plane.

Also, as shown in FIG. 12 and FIG. 13, the centers of these four spots are shifted from the center of the pole figure (Psi=0 degree) in the sapphire [-1101] direction by about 9°, 6° and 6°, respectively. They coincide with the shift amounts in the ω scanning described above. Accordingly, it was confirmed that the buffer layer 12 composed of MgO epitaxially grew with its (100) plane tilted with a [11-20] direction vector as a rotation axis by about 9° with respect to the R-plane of the substrate 11, the lead zirconate titanate niobate layers 13 and 15 epitaxially grew with their (100) plane in a cubic system expression tilted with a [11-20] direction vector as a rotation axis by about 6° with respect to the R-plane of the substrate 11, and the potassium niobate layer 14 epitaxially grew with its (100) plane in a pseudo cubic system expression tilted with a [11-20] direction vector as a rotation axis by about 6° with respect to the R-plane of the substrate 11.

Furthermore, it was confirmed that the potassium niobate deposited body 200 obtained in the present exemplary embodiment had good surface morphology, like the first exemplary embodiment. Also, the potassium niobate deposited body 200 of the present exemplary embodiment was transparent when observed by naked eye. This means that the surface of the potassium niobate layer 14 is flat and its crystal grains are uniform.

3. Third Embodiment

Figure 16:
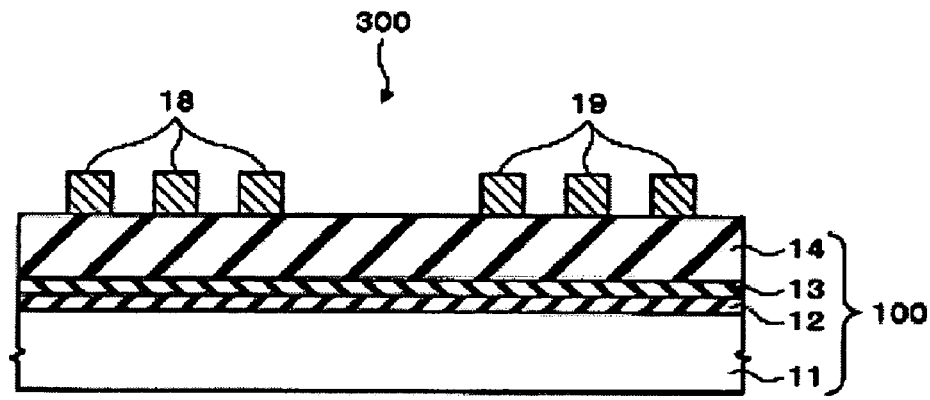
FIG. 16 is a cross-sectional view showing a surface acoustic wave element in accordance with a third embodiment.

Next, an example of a surface acoustic wave element in accordance with a third embodiment of the invention is described with reference to the accompanying drawings. FIG. 16 is a cross-sectional view schematically showing a surface acoustic wave element 300 in accordance with the present embodiment. In FIG. 16, members that are substantially the same as the members of the potassium niobate deposited body 100 shown in FIG. 1 are appended with the same reference numbers, and their detailed description is omitted.

The surface acoustic wave element 300 includes a substrate 11, a buffer layer 12 formed on the substrate 11, a lead zirconate titanate niobate layer 13 formed on the buffer layer 12, a pottasium niobate layer 14 formed on the lead zirconate titanate niobate layer 13, and inter-digital transducers (hereafter, referred to as "IDT electrodes") 18 and 19 formed on the potassium niobate layer 14. The IDT electrodes 18 and 19 have predetermined patterns.

The surface acoustic wave element 300 in accordance with the present embodiment includes a potassium niobate deposited body in accordance with an embodiment of the invention, for example, the potassium niobate deposited body 100 shown in FIG. 1. Accordingly, the potassium niobate layer 14 composing the surface acoustic wave element 300 has the same characteristics as those of the potassium niobate layer 14 of the potassium niobate deposited body 100. The potassium niobate layer 14 is composed of single crystal or polycrystal potassium niobate, as described above.

The surface acoustic wave element 300 in accordance with the present embodiment may be formed with a potassium niobate deposited body in accordance with an embodiment of the invention, for example, in the following manner.

First, a metal layer is formed by, for example, a vacuum vapor deposition method on the pottasium niobate layer 14 of the pottasium niobate deposited body 100 shown in FIG. 1. As the metal layer, for example, aluminum can be used. Next, the metal layer is patterned by using known lithography and etching techniques, to thereby form IDT electrodes 18 and 19 on the pottasium niobate layer 14.

The surface acoustic wave element in accordance with the present embodiment has a potassium niobate deposited body in accordance with an embodiment of the invention. Therefore, in accordance with the present embodiment, a surface acoustic wave element having a high electromechanical coupling coefficient can be realized.

Next, an example of experiments conducted on the surface acoustic wave element 300 in accordance with the present embodiment is described below.

A surface acoustic wave element 300 in accordance with the present exemplary embodiment was formed by using the potassium niobate deposited body 100 of the first exemplary embodiment in accordance with the first embodiment described above. The potassium niobate deposited body 100 had a transparent potassium niobate layer 14 in single crystal. It is noted that, as the IDT electrodes, aluminum layers of 100 nm in thickness were used. Line and space (L & S) of the IDT electrodes was 1.25 µm.

The propagation speed $V_{open}$ of surface acoustic wave between the IDT electrodes 18 and 19 was measured with the obtained surface acoustic wave element 300. An acoustic velocity obtained based on the measurement results was 5000 m/s. Also, the electromechanical coupling coefficient obtained based on a difference between the above and the propagation speed $V_{short}$ of surface acoustic wave when an area between the IDT electrodes 18 and 19 was covered by a metal thin film was 20%.

It is noted that, when a potassium niobate layer was directly formed on a buffer layer without using a lead zirconate titanate niobate layer 13, the electromechanical coupling coefficient was 10%. Accordingly, in accordance with the present exemplary embodiment, it was confirmed that, by forming the first lead zirconate titanate niobate layer 13 on the potassium niobate layer 14, the electromechanical coupling coefficient would be improved.

4. Fourth Embodiment

Figure 17:
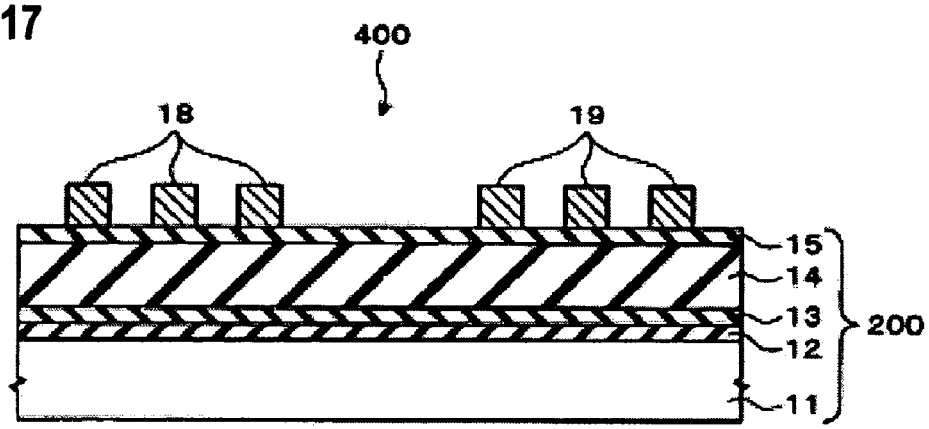
FIG. 17 is a cross-sectional view showing a surface acoustic wave element in accordance with a fourth embodiment.

Next, an example of a surface acoustic wave element in accordance with a fourth embodiment of the invention is described with reference to the accompanying drawings. FIG. 17 is a cross-sectional view schematically showing a surface acoustic wave element 400 in accordance with the present embodiment. In FIG. 17, members that are substantially the same as the members of the potassium niobate deposited body 200 shown in FIG. 15 are appended with the same reference numbers, and their detailed description is omitted.

The surface acoustic wave element 400 includes a substrate 11, a potassium niobate deposited body composed of a buffer layer 12, a first lead zirconate titanate niobate layer 13, a pottasium niobate layer 14 and a second lead zirconate titanate niobate layer 15, formed on the substrate 11, and inter-digital transducers (hereafter, referred to as "IDT electrodes") 18 and 19 formed on the second lead zirconate titanate niobate layer 15. The IDT electrodes 18 and 19 have predetermined patterns.

The surface acoustic wave element 400 in accordance with the present embodiment includes a potassium niobate deposited body in accordance with an embodiment of the invention, for example, the potassium niobate deposited body 200 shown in FIG. 15. Accordingly, the lead zirconate titanate niobate layers 13 and 15 and the potassium niobate layer 14 composing the surface acoustic wave element 400 have characteristics similar to those described in the second embodiment. In other words, the lead zirconate titanate niobate layers 13 and 15 and the potassium niobate layer 14 have the crystalline structure by epitaxial growth with the specified orientation, and four-time symmetry.

The surface acoustic wave element 400 in accordance with the present embodiment may be formed, for example, in the following manner.

First, a metal layer is formed by, for example, a vacuum vapor deposition method on the second lead zirconate titanate niobate layer 15 of the pottasium niobate deposited body 200 shown in FIG. 15. As the metal layer, for example, aluminum can be used. Next, the metal layer is patterned by using known lithography and etching techniques, to thereby form IDT electrodes 18 and 19 on the second lead zirconate titanate niobate layer 15. In accordance with the present embodiment, because of the presence of the second lead zirconate titanate niobate layer 15, the surface morphology of the potassium niobate deposited body becomes excellent, such that, for example, the IDT electrodes 18 and 19 with excellent interface state can be formed.

The surface acoustic wave element 400 in accordance with the present embodiment has the potassium niobate layer 14 and the second lead zirconate titanate niobate layer 15, which mainly determine the device characteristics. Therefore, in accordance with the present embodiment, a surface acoustic wave element having a high electromechanical coupling coefficient can be realized.

Next, an example of experiments conducted on the surface acoustic wave element 400 in accordance with the present embodiment is described below.

A surface acoustic wave element 400 in accordance with the present exemplary embodiment was formed with the potassium niobate deposited body 200 of the second exemplary embodiment in accordance with the second embodiment described above. As the IDT electrodes, aluminum layers of 100 nm in thickness were used. In other words, aluminum films having a thickness of 100 nm were used as the IDT electrode. Further, line and space (L & S) of the IDT electrodes was 1.25 µm.

The propagation speed $V_{open}$ of surface acoustic wave between the IDT electrodes 18 and 19 was measured with the obtained surface acoustic wave element 400. An acoustic velocity obtained based on the measurement results was 5000 m/s. Also, the electromechanical coupling coefficient obtained based on a difference between the above and the propagation speed $V_{short}$ of surface acoustic wave when an area between the IDT electrodes 18 and 19 was covered by a metal thin film was 25%.

Moreover, it was confirmed that, by additionally forming the lead zirconate titanate niobate layer 14 on the potassium niobate layer 14, the electromechanical coupling coefficient would be further improved, compared to the third embodiment.

5. Fifth Embodiment

Figure 18:
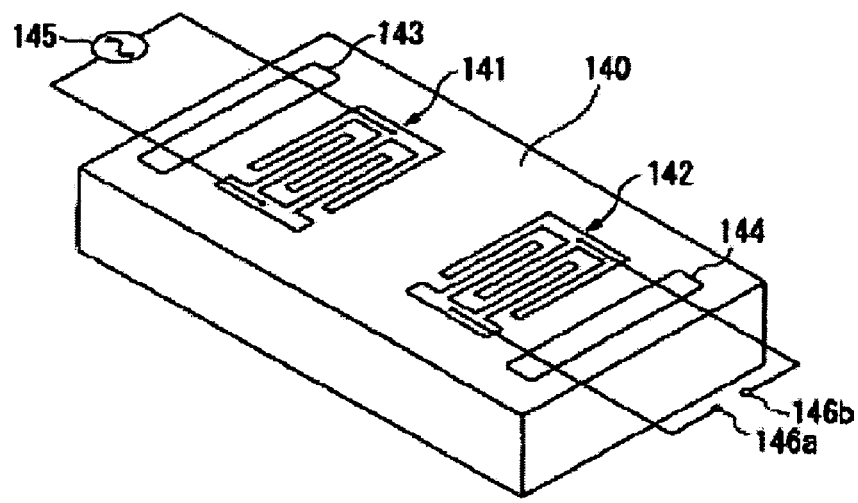
FIG. 18 is a perspective view showing a frequency filter in accordance with a fifth embodiment.

Next, an example of a frequency filter in accordance with a fifth embodiment of the invention is described with reference to the accompanying drawings. FIG. 18 is a view schematically showing a frequency filter in accordance with the present embodiment.

As shown in FIG. 18, the frequency filter has a base substrate 140. A potassium niobate deposited body in accordance with an embodiment of the invention, for example, one of the potassium niobate deposited bodies 100 and 200 shown in FIG. 1 and FIG. 15, respectively, may be used as the base substrate 140.

IDT electrodes 141 and 142 are formed on an upper surface of the base substrate 140. Also, acoustic absorber sections 143 and 144 are formed on the upper surface of the base substrate 140 in a manner to interpose the IDT electrodes 141 and 142. The acoustic absorber sections 143 and 144 absorb surface acoustic waves that propagate over the surface of the base substrate 140. A high frequency signal source 145 is connected to the IDT electrode 141 formed on the base substrate 140, and a signal line is connected to the IDT electrode 142.

Next, operations of the aforementioned frequency filter are described.

When a high frequency signal is outputted from the high frequency signal source 145 in the above-described structure, the high frequency signal is impressed to the IDT electrode 141, whereby a surface acoustic wave is generated on the upper surface of the base substrate 140. The surface acoustic waves propagating from the IDT electrode 141 toward the sound absorbing portion 143 are absorbed by the sound absorbing portion 143. However, among the surface acoustic waves propagating toward the IDT electrode 142, only those surface acoustic waves with a specific frequency or specific band frequency determined according to the pitch and the like of the IDT electrode 142 are converted to electric signals, and outputted to terminals 146a and 146b via the signal line. It is noted that the majority of frequency components other than the aforementioned specific frequency or specific band frequency is absorbed by the sound absorbing portion 144 after passing through the IDT electrode 142. In this way, of the electric signals supplied to the IDT electrode 141 provided in the frequency filter of the present embodiment, it is possible to obtain (filter) only surface acoustic waves of a specific frequency or specific band frequency.

6. Sixth Embodiment

Figure 19:
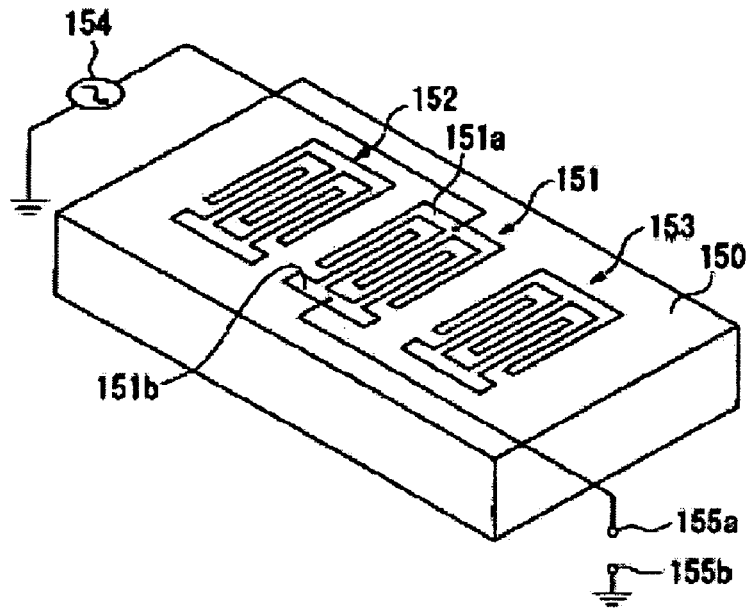
FIG. 19 is a perspective view showing an oscillator in accordance with a sixth embodiment.

Next, an example of an oscillator in accordance with a sixth embodiment of the invention is described with reference to the accompanying drawings. FIG. 19 is a view schematically showing an oscillator in accordance with the present embodiment.

As shown in FIG. 19, the oscillator has a base substrate 150. As the base substrate 150, a potassium niobate deposited body in accordance with an embodiment of the invention, for example, one of the potassium niobate deposited bodies 100 and 200 shown in FIG. 1 and FIG. 15, respectively, may be used, like the frequency filter described above.

An IDT electrode 151 is formed on an upper surface of the base substrate 150, and IDT electrodes 152 and 153 are formed in a manner to interpose the IDT electrode 151. A high frequency signal source 154 is connected to one of comb teeth-shaped electrodes 151a which form the IDT electrode 151, while a signal line is connected to the other comb teeth-shaped electrode 151b. It is noted that the IDT electrode 151 corresponds to an electric signal application electrode, and the IDT electrodes 152 and 153 correspond to resonating electrodes for resonating a specific frequency component or a specific band frequency component of the surface acoustic waves generated by the IDT electrode 151.

Next, operations of the aforementioned oscillator are described.

When a high frequency signal is outputted from the high frequency signal source 154 in the above-described structure, this high frequency signal is impressed on one of the comb teeth-shaped electrodes 151a of the IDT electrode 151. As a result, surface acoustic waves that propagate toward the IDT electrode 152 and surface acoustic waves that propagate toward the IDT electrode 153 are generated on the upper surface of the base substrate 150. Of these surface acoustic waves, those surface acoustic waves of a specific frequency component are reflected at the IDT electrode 152 and the IDT electrode 153, and a standing wave is generated between the IDT electrode 152 and the IDT electrode 153. The surface acoustic wave with this specific frequency component is repeatedly reflected at the IDT electrode 152 and the IDT electrode 153. As a result, the specific frequency components or specific band frequency components are resonated and the amplitude increases. A portion of the surface acoustic waves of the specific frequency component or the specific band frequency component are extracted from the other comb teeth-shaped electrode 151b of the IDT electrode 151, and the electric signal of the frequency (or the frequency having a certain band) corresponding to the resonance frequency between the IDT electrode 152 and the IDT electrode 153 can be extracted at terminals 155a and 155b.

Figure 20:
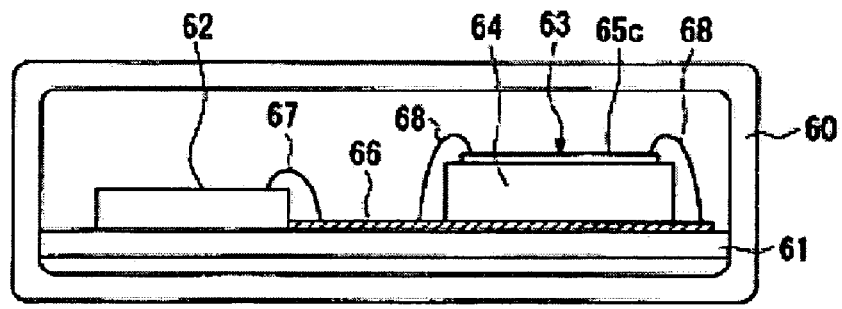
FIG. 20 is a schematic cut-out side view of an example in which the oscillator in accordance with the sixth embodiment is applied to a VCSO.
Figure 21:
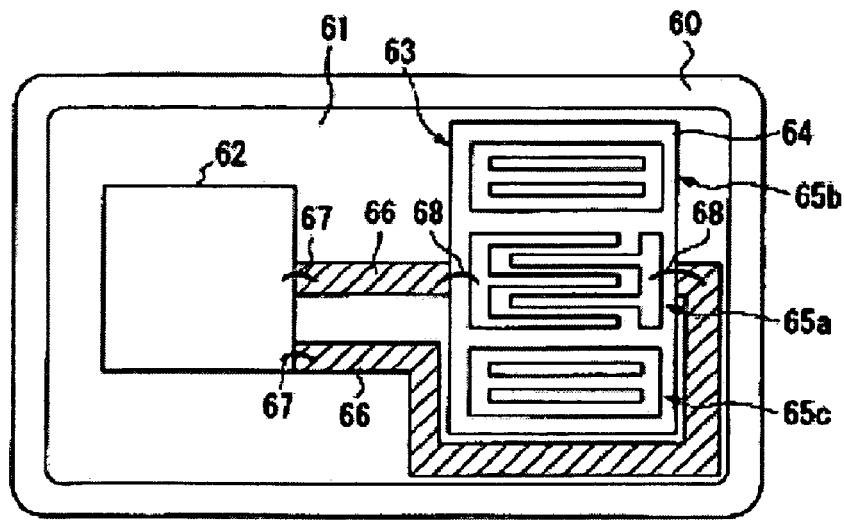
FIG. 21 is a schematic cut-out plan view of the example in which the oscillator in accordance with the sixth embodiment is applied to a VCSO.

FIG. 20 and FIG. 21 are views schematically showing an example in which the oscillator described above is applied to a VCSO (Voltage Controlled SAW Oscillator). FIG. 20 is a cut-out side view, and FIG. 21 is a cut-out plan view.

The VCSO is housed inside a metallic (aluminum or stainless steel) box 60. An IC (integrated circuit) 62 and an oscillator 63 are mounted on a substrate 61. In this case, the IC 62 is an oscillation circuit that controls the frequency to be applied to the oscillator 63 in response to the voltage value inputted from an external circuit (not shown).

The oscillator 63 includes IDT electrodes 65a, 65b and 65c formed on a base substrate 64. Its structure is generally the same as that of the oscillator shown in FIG. 19. As the base substrate 64, like the oscillator described above and shown in FIG. 19, a potassium niobate deposited body in accordance with an embodiment of the invention, for example, one of the potassium niobate deposited bodies 100 and 200 shown in FIG. 1 and FIG. 15, respectively, may be used.

A wiring 66 for electrically connecting the IC 62 and the oscillator 63 is patterned on the substrate 61. For example, the IC 62 and the wiring 66 are connected by a wire line 67 composed of gold or the like, and the oscillator 63 and the wiring 66 are connected by a wire line 68 composed of gold or the like, whereby the IC 62 and oscillator 63 are electrically connected to each other through the wiring 66.

Figure 22:
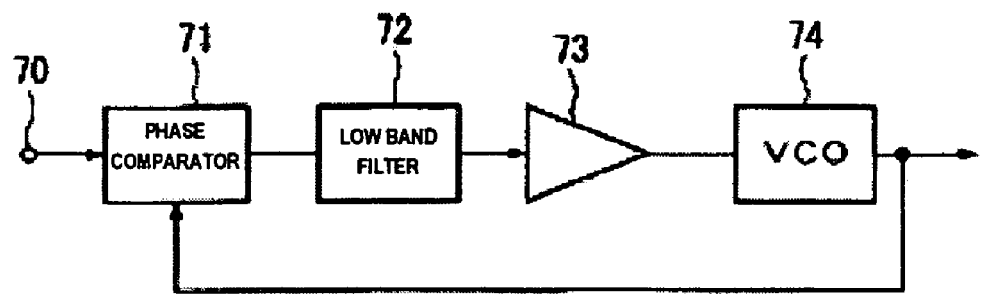
FIG. 22 is a block diagram of the basic structure of a PLL circuit.

The VCSO shown in FIG. 20 and FIG. 21 can be used, for example, as a VCO (Voltage Controlled Oscillator) for a PLL circuit shown in FIG. 22. FIG. 22 is a block diagram showing the basic structure of a PLL circuit. The PLL circuit is formed from a phase comparator 71, a low band filter 72, an amplifier 73 and a VCO 74. The phase comparator 71 compares the phases (or frequencies) of signals inputted from an input terminal 70 and outputted from the VCO 74, and outputs an error voltage signal, the value of which is set according to the difference between these signals. The low band filter 72 transmits only the low frequency components at the position of the error voltage signal outputted from the phase comparator 71. The amplifier 73 amplifies the signal outputted from the low band filter 72. The VCO 74 is an oscillator circuit in which the oscillation frequency oscillating according to the voltage value inputted is continuously changed within a certain range.

The PLL circuit having such a structure operates so as to decrease the difference between the phases (or frequencies) inputted through the input terminal 70 and outputted from the VCO 74, and synchronizes the frequency of the signal outputted from the VCO 74 with the frequency of the signal inputted through the input terminal 70. When the frequency of the signal outputted from the VCO 74 and the frequency of the signal inputted through the input terminal 70 are synchronized with each other, the PLL circuit outputs a signal that matches with the signal inputted through the input terminal 70 after excluding a specific phase difference, and conforms to the changes in the input signal.

As described above, frequency filters and oscillators in accordance with the present embodiment have surface acoustic wave elements having a high electromechanical coupling coefficient in accordance with an embodiment of the invention. Therefore, in accordance with the present embodiment, miniaturization of frequency filters and oscillators can be realized.

Figure 23:
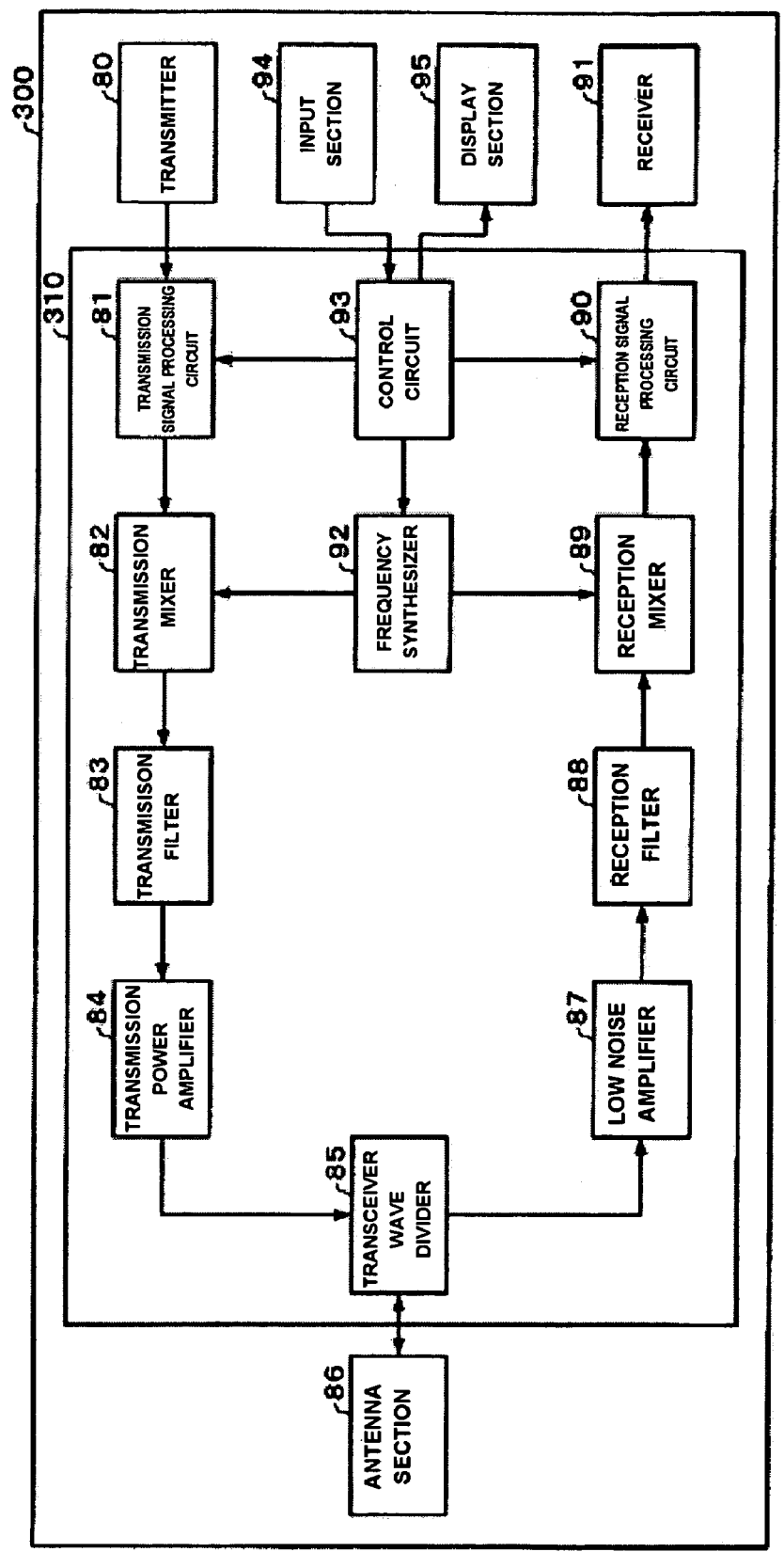
FIG. 23 is a block diagram showing the structure of an electronic circuit in accordance with a seventh embodiment of the present invention.

7. Seventh Embodiment 7.1. Next, first examples of an electronic circuit and an electronic apparatus in accordance with a seventh embodiment of the invention are described with reference to the accompanying drawings. FIG. 23 is a block diagram showing an electrical structure of an electronic device 500 in accordance with the embodiment. It is noted that the electronic device 500 may be, for example, a cellular phone.

The electronic device 500 includes an electronic circuit 510, a transmitter 80, a receiver 91, an input section 94, a display section 95, and an antenna section 86. The electronic circuit 510 includes a transmission signal processing circuit 81, a transmission mixer 82, a transmission filter 83, a transmission power amplifier 84, a transceiver wave divider 85, a low noise amplifier 87, a reception filter 88, a reception mixer 89, a reception signal processing circuit 90, a frequency synthesizer 92, and a control circuit 93.

In the electronic circuit 510, the frequency filter shown in FIG. 18 can be used as the transmission filter 83 and the reception filter 88. The frequency that is filtered (i.e., the frequency which is permitted to pass through the filter) is set separately at the transmission filter 83 and the reception filter 88 according to the required frequency in the signal outputted from the transmission mixer 82 and the required frequency at the reception mixer 89. As the VCO 74 of the PLL circuit (see FIG. 22) that is provided within the frequency synthesizer 92, the oscillator shown in FIG. 19, or the VCSO shown in FIG. 20 and FIG. 21 can be used.

The transmitter 80 can be realized, for example, with a microphone which converts sound wave signals into electric signals. The transmission signal processing circuit 81 is a circuit for performing such processing as D/A conversion, modulation, etc. on the electric signal to be outputted from the transmitter 80. The transmission mixer 82 mixes the signal outputted from the transmission signal processing circuit 81 using the signal outputted from the frequency synthesizer 92. The transmission filter 83 permits passage of only those signals of the required frequency from among the intermediate frequencies (hereafter referred to as "IF"), and cuts unnecessary frequency signals. The signal outputted from the transmission filter 83 is converted to an RF signal by a converting circuit (not shown). The transmission power amplifier 84 amplifies the power of the RF signal outputted from the transmission filter 83 and outputs this amplified result to the transceiver wave divider 85.

The transceiver wave divider 85 transmits the RF signal that is outputted from the transmission power amplifier 84 through the antenna section 86 in the form of radio waves. Also, the transceiver wave divider 85 divides the reception signal received by the antenna 86, and outputs the result to the low noise amplifier 87. The low noise amplifier 87 amplifies the reception signal from the transceiver wave divider 85. It is noted that the signal outputted from the low noise amplifier 87 is converted to IF by a converting circuit (not shown).

The reception filter 88 permits passage of only those signals with the required frequency from among the IF that were converted by a converting circuit (not shown), and cuts unnecessary frequency signals. The reception mixer 89 uses the signal outputted from the frequency synthesizer 92 to mix the signals outputted from the reception filter 88. The reception signal processing circuit 90 performs such processing as A/D conversion, demodulation, etc., to the signal outputted from the reception mixer 89. The receiver 91 is realized with, for example, a small speaker or the like which converts electrical signals into sound waves.

The frequency synthesizer 92 is a circuit that generates the signal to be supplied to the transmission mixer 82 and the signal to be supplied to the reception mixer 89. The frequency synthesizer 92 is equipped with a PLL circuit. The frequency synthesizer 92 divides the signal outputted from this PLL circuit and can generate a different signal. The control circuit 93 controls the transmission signal processing circuit 81, the reception signal processing circuit 90, the frequency synthesizer 92, the input section 94, and the display section 95. The display section 95 displays, for example, the device status to the user of the cellular phone. The input section 94 is provided, for example, for the user of the cellular phone to input directions.

Figure 24:
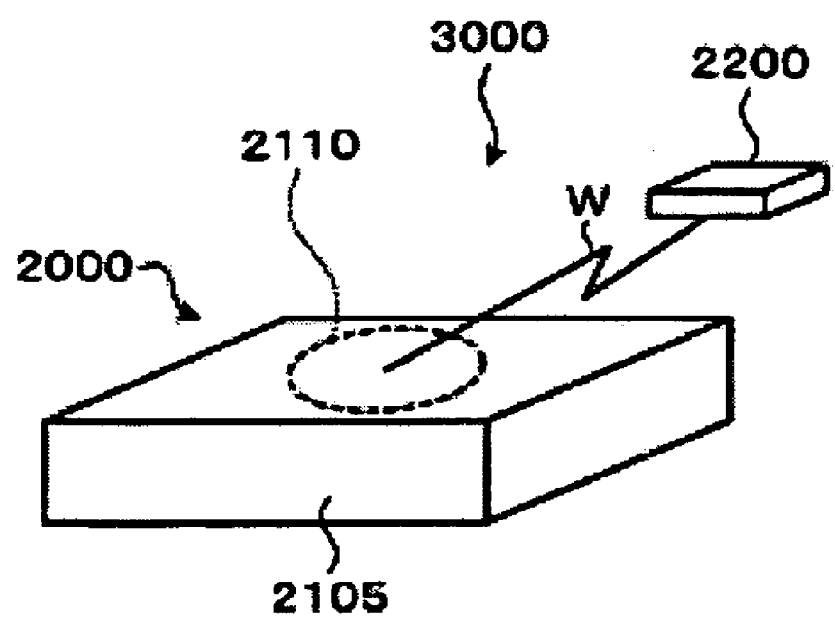
FIG. 24 is a view showing a communications system that uses a reader/writer in accordance with the seventh embodiment.
Figure 25:
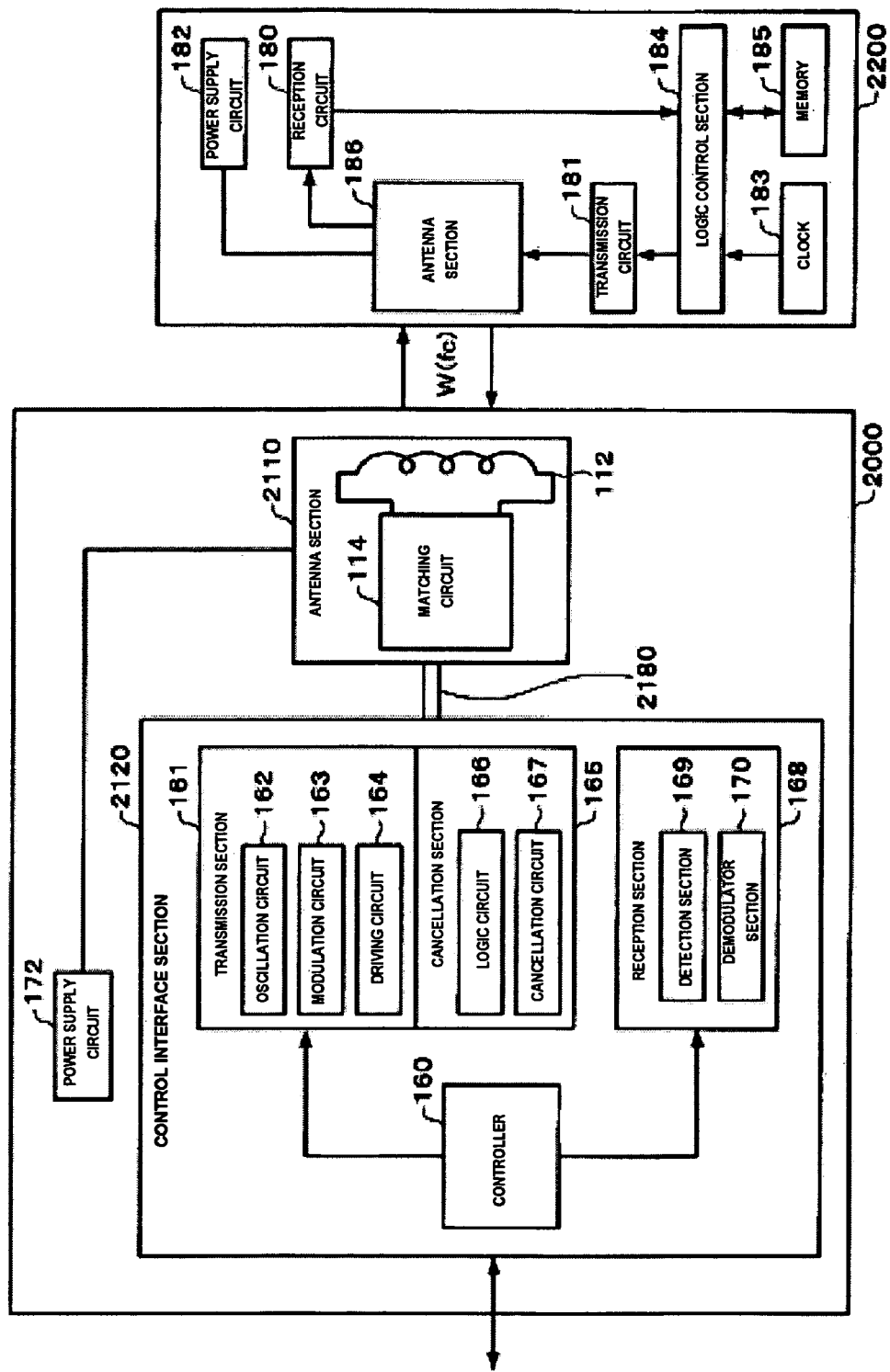
FIG. 25 is a schematic block diagram of the communications system shown in FIG. 24.

7.2. Next, second examples of an electronic circuit and an electronic apparatus in accordance with the seventh embodiment of the invention are described with reference to the accompanying drawings. In the present embodiment, a reader/writer 2000 and a communications system 3000 that uses the reader/writer 2000 are described as examples of an electronic device. FIG. 24 is a view showing the communications system 3000 that uses the reader/writer 2000 in accordance with the present embodiment, and FIG. 25 is a schematic block diagram of the communications system 3000 shown in FIG. 24.

As shown in FIG. 24 the communications system 3000 includes the reader/writer 2000 and a contactless information medium 2200. The reader/writer 2000 transmits a radio wave W (hereafter also referred to as a "career") having a carrier frequency $f_c$ to the contactless information medium 2200 or receives the same from the contactless information medium 2200, to thereby communicate with the contactless information medium 2200 by using radio communications. The radio wave W can use any carrier frequency fc in an arbitrary frequency band. As shown in FIG. 24 and FIG. 25, the reader/writer 2000 has a main body 2105, an antenna section 2110 located on the top surface of the main body 2105, a control interface section 2120 stored in the main body 2105, and a power supply circuit 172. The antenna section 2110 and the control interface section 2120 are electrically connected to each other by a cable 2180. Further, although not shown, the reader/writer 2000 is connected to an external host apparatus (processor apparatus, etc.) through the control interface section 2120.

The antenna section 2110 has the function to communicate information with the contactless information medium 2200. The antenna section 2110 has a prescribed communication area (area shown by a dotted line), as shown in FIG. 24. The antenna section 2110 is composed of a loop antenna 112 and a matching circuit 114.

The control interface section 2120 includes a transmission section 161, a damping oscillation cancellation section (hereafter, referred to as a "cancellation section") 165, a reception section 168, and a controller 160.

The transmission section 161 modulates data transmitted from an external unit (not shown), and transmits the same to a loop antenna 112. The transmission section 161 has an oscillation circuit 162, a modulation circuit 163, and a driving circuit 164. The oscillation circuit 162 is a circuit for generating a carrier with a predetermined frequency. The oscillation circuit 162 is usually formed with a quartz oscillator or the like. By using the oscillator in accordance with the embodiment described above, its communication frequency can be improved to a higher frequency and its detection sensitivity can be improved. The modulation circuit 163 is a circuit that modulates the carrier according to information given. The driving circuit 164 receives the modulated career, amplifies its electric power, and drives the antenna section 2110.

The cancellation section 165 functions to control a damped oscillation generated by the loop antenna 112 of the antenna section 2110 which occurs with ON/OFF of the career. The cancellation section 165 includes a logic circuit 166 and a cancellation circuit 167.

The reception section 168 includes a detection section 169 and a demodulator circuit 170. The reception section 168 demodulates a signal that is transmitted from the contactless information medium 2200. The detection section 169 detects, for example, a change in the current that circulates in the loop antenna 112. The detection section 169 may include, for example, an RF filter. As the RF filter, a quartz oscillator or the like may be used. By using the frequency filter in accordance with the embodiment described above as the RF filter, the communication frequency can be improved to a higher frequency, the detection sensitivity can be improved, and miniaturization becomes possible. The demodulator circuit 170 demodulates the changed portion detected by the detection section 169.

The controller 160 retrieves information from the demodulated signal, and transfers the same to an external device. The power supply circuit 172 receives the supply of an electric power from outside, appropriately converts the voltage, and supplies a necessary electric power to each circuit. It is noted that a built-in battery may be used as the power source.

The contactless information medium 2200 communicates with the reader/writer 2000 by using electromagnetic waves (radio waves). As the contactless information medium 2200, for example, a contactless IC tag, a contactless IC card or the like can be enumerated.

Next, operations of the communication system 3000 that uses the reader/writer 2000 in accordance with the present embodiment are described. When data is sent to the contactless information medium 2200 from the reader/writer 2000, if the data is sent from an external device (not shown), the data is processed by the controller 160 in the reader/writer 2000 and sent to the transmission section 161. In the transmission section 161, a high frequency signal of constant amplitude is supplied from the oscillation circuit 162 as a career, the career is modulated by the modulation circuit 163, and a modulated high frequency signal is outputted. The modulated high frequency signal outputted from the modulation circuit 163 is supplied to the antenna section 2110 through the driving circuit 164. At the same time, the cancellation section 165 generates a predetermined pulse signal in synchronism with an OFF timing of the modulated high frequency signal, to thereby contribute to the control of the damping oscillation in the loop antenna 112.

In the contactless information medium 2200, the modulated high frequency signal is supplied through an antenna section 186 to a reception circuit 180. Also, the modulated high frequency signal is supplied to a power supply circuit 182 by which a predetermined power supply voltage necessary for each section of the contactless information medium 2200 is generated. The data outputted from the reception circuit 180 is demodulated and supplied to a logic control circuit 184. The logic control circuit 184 operates based on the output of a clock 183, processes the supplied data, and writes certain data in a memory 185.

When data is sent from the contactless information medium 2200 to the reader/writer 2000, the following operations take place. In the reader/writer 2000, a high frequency signal of constant amplitude is outputted from the modulation circuit 163 without being modulated. The high frequency signal is sent to the contactless information medium 2200 through the driving circuit 164 and the loop antenna 112 of the antenna section 2110.

In the contactless information medium 2200, data read from the memory 185 is processed by the logic control circuit 184, and supplied to a transmission circuit 181. The transmission circuit 181 may have a switch, wherein the switch turns ON and OFF according to "1" and "0" bit of the data.

In the reader/writer 2000, when the switch of the transmission circuit 181 turns ON and OFF, the load on the loop antenna 112 of the antenna section 2110 changes. Therefore, the amplitude of the high frequency current that circulates in the loop antenna 112 changes. In other words, the high frequency current is amplitude-modulated by the data supplied from the contactless information medium 2200. The high frequency current is detected by the detection section 169 of the reception section 168, and demodulated by the demodulation circuit 170 whereby data is obtained. The data is processed by the controller 160, and transmitted to an external apparatus or the like.

7.3. Electronic circuits and electronic devices in accordance with the embodiment of the invention have surface acoustic wave elements in accordance with the embodiment of the invention having a high electromechanical coupling coefficient. Therefore, in accordance with the present embodiment, power saving in electronic circuits and electronic devices can be achieved.

The embodiments of the invention are described above in detail. However, those skilled in the art should readily understand that many modifications can be made without substantially departing from the novel matter and effects of the invention. Accordingly, all of such modified examples are also included in the scope of the invention.

For example, frequency filters and oscillators in accordance with the embodiments of the invention are applicable to wide-band filters and VCOs in UWB systems, cellular phones, wireless LAN and other like devices, respectively.

For example, in the embodiments described above, a cellular phone and a communications system using a reader/writer device are described as examples of electronic apparatuses, and electronic circuits provided in the cellular phone and the reader/writer device are described as examples of electronic circuits. However, the invention is not limited to those described above, and is applicable to various mobile telecommunications equipment and electronic circuits provided therein. For example, the embodiments of invention are also applicable to floor type telecommunications equipment such as tuners that receive BS (Broadcast Satellite) broadcasting and electronic circuits installed therein, and also applicable to electronic equipment such as HUB or the like that use optical signals that propagate in optical cables and electronic circuits installed therein.

What is claimed is:

1. A potassium niobate deposited body comprising:
   an R-plane sapphire substrate;
   a buffer layer composed of a metal oxide and formed above the R-plane sapphire substrate;
   a lead zirconate titanate niobate layer formed above the buffer layer; and a potassium niobate layer or a potassium niobate solid solution layer formed above the lead zirconate titanate niobate layer.

2. A potassium niobate deposited body according to claim 1, wherein the R-plane sapphire substrate is an R-plane (1-102).

3. A potassium niobate deposited body according to claim 1, wherein the buffer layer epitaxially grows in a (100) orientation in a cubic system expression, and a (100) plane of the buffer layer tilts with a [11-20] direction vector as a rotation axis with respect to the R-plane (1-102) of the R-plane sapphire substrate.

4. A potassium niobate deposited body according to claim 3, wherein an angle defined between the (100) plane of the buffer layer and the R-plane (1-102) of the R-plane sapphire substrate is 1 degree or greater but 15 degrees or smaller.

5. A potassium niobate deposited body according to claim 1, wherein the potassium niobate layer or the potassium niobate solid solution layer epitaxially grows in a (100) orientation in a psuedo cubic system expression, and a (100) plane of the potassium niobate layer or the potassium niobate solid solution layer tilts with a [11-20] direction vector as a rotation axis with respect to the R-plane (1-102) of the R-plane sapphire substrate.

6. A potassium niobate deposited body according to claim 5, wherein, an angle defined between a (100) plane of the potassium niobate layer or the potassium niobate solid solution layer and the R-plane (1-102) of the R-plane sapphire substrate is 1 degree or greater but 15 degrees or smaller.

7. A potassium niobate deposited body according to claim 1, wherein the lead zirconate titanate niobate layer epitaxially grows in a (100) orientation in a cubic system expression, and a (100) plane of the lead zirconate titanate niobate layer tilts with a [11-20] direction vector as a rotation axis with respect to the R-plane (1-102) of the R-plane sapphire substrate.

8. A potassium niobate deposited body according to claim 7, wherein an angle defined between a (100) plane of the lead zirconate titanate niobate layer and the R-plane (1-102) of the R-plane sapphire substrate is 1 degree or greater but 15 degrees or smaller.

9. A potassium niobate deposited body according to claim 1, wherein the buffer layer consists of a metal oxide having a rock salt structure.

10. A potassium niobate deposited body according to claim 9, wherein the metal oxide is magnesium oxide.

11. A potassium niobate deposited body according to claim 1, wherein the potassium niobate solid solution layer is a solid solution that is expressed by $K_{1-x}Na_xNb_{1-y}Ta_yO_3$ ($0<x<1$, $0<y<1$).

12. A potassium niobate deposited body according to claim 1, wherein the lead zirconate titanate niobate layer includes niobium in 5 mol % or greater and 30 mol % or smaller with respect to niobium, titanium and zirconium.

13. A potassium niobate deposited body according to claim 1, wherein the lead zirconate titanate niobate layer further includes silicon or silicon and germanium in 0.5 mol % or greater.

14. A potassium niobate deposited body according to claim 1 further comprising another lead zirconate titanate niobate layer above the potassium niobate layer.

15. A method for manufacturing a potassium niobate deposited body comprising the steps of:

forming, above an R-plane sapphire substrate, a buffer layer that epitaxially grows in a (100) orientation in a cubic system expression;

forming, above the buffer layer, a lead zirconate titanate niobate layer by coating a precursor composition, and then applying a heat treatment to the precursor composition; and forming a potassium niobate layer or a potassium niobate solid solution layer above the lead zirconate titanate niobate layer, wherein the precursor composition includes a precursor for forming lead zirconate titanate niobate, and the precursor includes at least niobium, titanium and zirconium, and has an ester bond in part.

16. A method for manufacturing a potassium niobate deposited body according to claim 15, wherein the precursor further includes lead.

17. A method for manufacturing a potassium niobate deposited body according to claim 15, wherein the precursor composition is formed from the precursor dissolved or dispersed in a solvent.

18. A method for manufacturing a potassium niobate deposited body according to claim 15, wherein the precursor composition is obtained by mixing sol-gel raw materials including hydrolysis-condensation products of metal alkoxides of at least niobate, titanium and zirconium, polycarboxylic acid or polycarboxylic acid ester, and an organic solvent, and includes a precursor having ester bonds by esterification of the polycarboxylic acid or polycarboxylic acid originated from the polycarboxylic acid ester and the metal alkoxides.

19. A method for manufacturing a potassium niobate deposited body according to claim 18, wherein the polycarboxylic acid or the polycarboxylic acid ester is polycarboxylic acid or polycarboxylic acid ester with a valence of 2.

20. A method for manufacturing a potassium niobate deposited body according to claim 15, wherein, when the sol-gel raw materials, the polycarboxylic acid or polycarboxylic acid ester, and the organic solvent are mixed, a sol-gel raw material using metal carboxylate is further included.

* * * * *